US011688840B2

(12) United States Patent
Jang et al.

(10) Patent No.: US 11,688,840 B2
(45) Date of Patent: Jun. 27, 2023

(54) LIGHT EMITTING DEVICE AND LED DISPLAY APPARATUS HAVING THE SAME

(71) Applicant: SEOUL VIOSYS CO., LTD., Ansan-si (KR)

(72) Inventors: Jong Min Jang, Ansan-si (KR); Sung Hyun Lee, Ansan-si (KR); Chang Yeon Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 295 days.

(21) Appl. No.: 17/133,623

(22) Filed: Dec. 23, 2020

(65) Prior Publication Data
US 2021/0202815 A1 Jul. 1, 2021

Related U.S. Application Data

(60) Provisional application No. 63/000,044, filed on Mar. 26, 2020, provisional application No. 62/954,406, filed on Dec. 28, 2019.

(51) Int. Cl.
*H01L 33/62* (2010.01)
*H01L 33/40* (2010.01)
(Continued)

(52) U.S. Cl.
CPC ............ *H01L 33/62* (2013.01); *H01L 27/156* (2013.01); *H01L 33/382* (2013.01); *H01L 33/40* (2013.01); *H01L 33/486* (2013.01)

(58) Field of Classification Search
CPC combination set(s) only.
See application file for complete search history.

(56) References Cited

U.S. PATENT DOCUMENTS 5,739,552 A * 4/1998 Kimura .................. H01L 33/20
257/89
6,100,103 A * 8/2000 Shim ...................... H01L 27/15
438/455

(Continued)

FOREIGN PATENT DOCUMENTS

| JP | 2011-176045 | 9/2011 |
| KR | 10-2016-0053138 | 5/2016 |
| KR | 10-1958419 | 3/2019 |

OTHER PUBLICATIONS

International Search Report dated Apr. 9, 2021 in International Application No. PCT/KR2020/019198 (with English Translation).

*Primary Examiner* — Mark W Tornow
*Assistant Examiner* — Priya M Rampersaud
(74) *Attorney, Agent, or Firm* — H.C. Park & Associates, PLC

(57) ABSTRACT

A light emitting device including a first light emitting stack, a second light emitting stack disposed under the first light emitting stack, a third light emitting stack disposed under the second light emitting stack, first, second, third, and fourth connection electrodes disposed over the first light emitting stack, and electrically connected to the first, second, and third light emitting stacks, and bonding metal layers disposed on upper surfaces of the first, second, third, and fourth connection electrodes, in which each of the first, second, third, and fourth connection electrodes includes a groove on an upper surface thereof, and the bonding metal layers cover the grooves of the first, second, third, and fourth connection electrodes, respectively.

18 Claims, 43 Drawing Sheets

(51) Int. Cl.
*H01L 33/48* (2010.01)
*H01L 27/15* (2006.01)
*H01L 33/38* (2010.01)

(56) References Cited

U.S. PATENT DOCUMENTS

| | | |
|---|---|---|
| 9,391,238 B2 | 7/2016 | Kim et al. |
| 10,103,305 B2 | 10/2018 | Yoon et al. |
| 2007/0170444 A1* | 7/2007 | Cao ................ H01L 33/382 |
| | | 257/E33.012 |
| 2016/0086874 A1* | 3/2016 | Choi ............... H01L 21/76898 |
| | | 257/774 |
| 2017/0358716 A1* | 12/2017 | Park ................ H01L 33/60 |
| 2019/0097088 A1* | 3/2019 | Huppmann ........ H01L 24/00 |
| 2019/0103510 A1 | 4/2019 | Cha et al. |
| 2019/0189596 A1 | 6/2019 | Chae et al. |
| 2020/0212006 A1* | 7/2020 | Chang ............. H01L 25/50 |

* cited by examiner

LIGHT EMITTING DEVICE AND LED DISPLAY APPARATUS HAVING THE SAME

CROSS REFERENCE TO RELATED APPLICATIONS

This application claims the benefit of U.S. Provisional Patent Application No. 62/954,406, filed on Dec. 28, 2019, and U.S. Provisional Patent Application No. 63/000,044, filed on Mar. 26, 2020, each of which is hereby incorporated by reference for all purposes as if fully set forth herein.

BACKGROUND

Field

Exemplary embodiments of the invention relate generally to a light emitting device and an LED display apparatus having the same.

Discussion of the Background

As an inorganic light source, light emitting diodes have been used in various fields including displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been generally used as backlight light sources in display apparatuses. However, LED displays that directly display images using the light emitting diodes have been recently developed.

In general, a display apparatus realizes various colors through mixture of blue, green, and red light. In order to display various images, the display apparatus include a plurality of pixels each including sub-pixels corresponding to blue, green, and red light, respectively. In this manner, a color of a certain pixel is determined based on the colors of the sub-pixels so that images can be displayed through combination of such pixels.

Since LEDs can emit various colors depending upon materials thereof, it is possible to provide a display apparatus by arranging individual light emitting devices emitting blue, green, and red light on a two-dimensional plane. However, when one light emitting device is arranged in each sub-pixel, the number of light emitting devices may be increased, which may require excessive amount of time for a mounting process during manufacture.

Meanwhile, the light emitting devices have been generally mounted on a circuit board or the like using a surface mounting technology. A surface mounting technology allows light emitting devices to be bonded onto a circuit board using a solder paste. However, when the size of light emitting devices become extremely small, such as in micro LEDs, an interval between bump pads of the LEDs may also become extremely small. As such, mounting light emitting devices on a circuit board or the like using a conventional surface mounting technology may not be feasible, and a new technology suitable for mounting the extremely small light emitting devices is required.

The above information disclosed in this Background section is only for understanding of the background of the inventive concepts, and, therefore, it may contain information that does not constitute prior art.

SUMMARY

Light emitting devices constructed according to exemplary embodiments of the invention are capable of reducing time for a mounting process time and a display apparatus having the same.

Exemplary embodiments also provide a light emitting device suitable for probing for electrical measurement and being mounted and a display apparatus having the same.

Additional features of the inventive concepts will be set forth in the description which follows, and in part will be apparent from the description, or may be learned by practice of the inventive concepts.

A light emitting device according to an exemplary embodiment includes a first light emitting stack, a second light emitting stack disposed under the first light emitting stack, a third light emitting stack disposed under the second light emitting stack, first, second, third, and fourth connection electrodes disposed over the first light emitting stack, and electrically connected to the first, second, and third light emitting stacks, and bonding metal layers disposed on upper surfaces of the first, second, third, and fourth connection electrodes, in which each of the first, second, third, and fourth connection electrodes includes a groove on an upper surface thereof, and the bonding metal layers cover the grooves of the first, second, third, and fourth connection electrodes, respectively.

The light emitting device may further include a barrier layer disposed between the bonding metal layer and the connection electrode.

The bonding metal layer may at least partially cover the upper surface of the connection electrode around the groove.

The connection electrode may include Cu, and the bonding metal layer includes Au.

The first light emitting stack may be electrically connected to the first connection electrode and the fourth connection electrode, the second light emitting stack may be electrically connected to the second connection electrode and the fourth connection electrode, and the third light emitting stack may be electrically connected to the third connection electrode and the fourth connection electrode.

Each of the first, second, and third light emitting stacks may include a first conductivity type semiconductor layer and a second conductivity type semiconductor layer, the first, second, and third connection electrodes may be electrically connected to the second conductivity type semiconductor layers of the first, second, and third light emitting stacks, respectively, and the fourth connection electrode may be electrically connected to the first conductivity type semiconductor layers of the first, second, and third light emitting stacks.

The first, second, third, and fourth connection electrodes may be disposed in an upper region of the first conductivity type semiconductor layer of the first light emitting stack.

The light emitting device may further include a first pad electrically connecting the first connection electrode to the first light emitting stack, a second pad electrically connecting the second connection electrode to the second light emitting stack, a third pad electrically connecting the third connection electrode to the third light emitting stack, and a fourth pad electrically connecting the fourth connection electrode to the first, second, and third light emitting stacks.

The light emitting device may further include a first lower contact electrode contacting the second conductivity type semiconductor layer of the first light emitting stack, a second lower contact electrode contacting the second conductivity type semiconductor layer of the second light emitting stack, and a third lower contact electrode contacting the second conductivity type semiconductor layer of the third light emitting stack, in which the first, second, and third pads are connected to the first, second, and third lower contact electrodes, respectively.

The light emitting device may further include a first upper contact electrode in ohmic contact with the first conductivity type semiconductor layer of the first light emitting stack, in which the first conductivity type semiconductor layer of the first light emitting stack may have a recessed region, and the first upper contact electrode may be disposed in the recessed region.

The fourth pad may be connected to the first upper contact electrode.

A display apparatus according to another exemplary embodiment includes a display substrate including bonding pads, and light emitting devices disposed on the display substrate, each of the light emitting devices including a first light emitting stack, a second light emitting stack disposed under the first light emitting stack, a third light emitting stack disposed under the second light emitting stack, first, second, third, and fourth connection electrodes disposed over the first light emitting stack, and electrically connected to the first, second, and third light emitting stacks, and bonding metal layers disposed on upper surfaces of the first, second, third, and fourth connection electrodes, in which each of the first, second, third, and fourth connection electrodes includes a groove on an upper surface thereof, the bonding metal layers cover the grooves of the first, second, third, and fourth connection electrodes, respectively, and the bonding metal layers are eutectic bonded to the bonding pads.

The bonding metal layers may include Au and the bonding pads may include at least one of In and Sn, and Au is eutectic bonded to In or Sn.

The connection electrode may include Cu.

The light emitting device may further include a barrier layer disposed between the bonding metal layer and the connection electrode.

The bonding metal layer may at least partially cover the upper surface of the connection electrode around the groove.

The first light emitting stack may be electrically connected to the first connection electrode and the fourth connection electrode, the second light emitting stack may be electrically connected to the second connection electrode and the fourth connection electrode, and the third light emitting stack may be electrically connected to the third connection electrode and the fourth connection electrode.

Each of the first, second, and third light emitting stacks may include a first conductivity type semiconductor layer and a second conductivity type semiconductor layer, the first, second, and third connection electrodes may be electrically connected to the second conductivity type semiconductor layers of the first, second, and third light emitting stacks, respectively, and the fourth connection electrode may be electrically connected to the first conductivity type semiconductor layers of the first, second, and third light emitting stacks.

The first, second, third, and fourth connection electrodes may be disposed in an upper region of the first conductivity type semiconductor layer of the first light emitting stack.

The display apparatus may further include a first pad electrically connecting the first connection electrode to the first light emitting stack, a second pad electrically connecting the second connection electrode to the second light emitting stack, a third pad electrically connecting the third connection electrode to the third light emitting stack, and a fourth pad electrically connecting the fourth connection electrode to the first, second, and third light emitting stacks.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
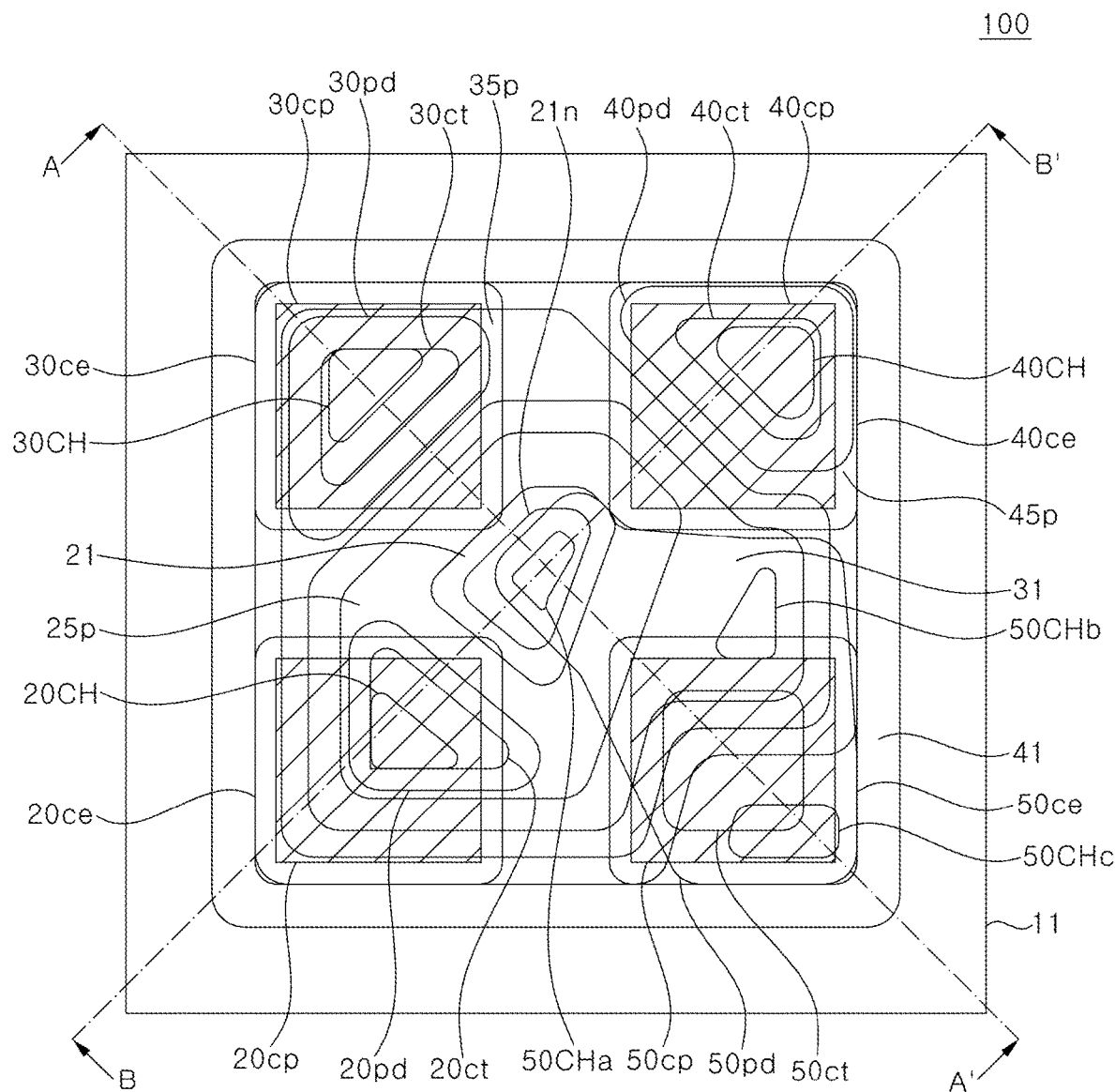
FIG. 1A is a schematic plan view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described in detail with reference to the accompanying drawings. Hereinafter, the light emitting device may include a micro-LED, which has a light emission area of 10,000 um$^2$ or less as known in the art. In other exemplary embodiments, the micro-LED may have a light emitting area of 4,000 um$^2$ or less, and further, 2,500 um$^2$ or less as also know in the art.

Figure 1B:
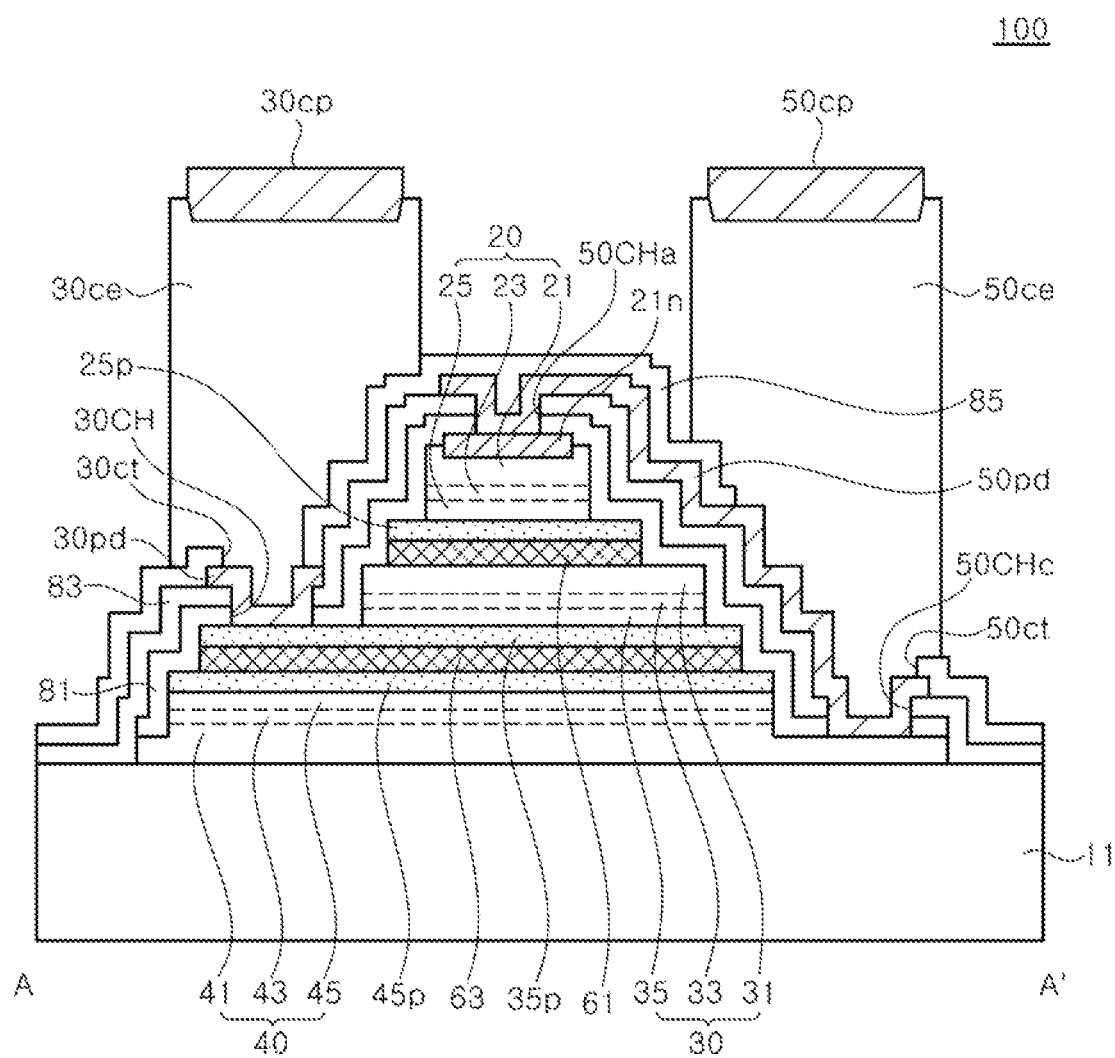
FIG. 1B and FIG. 1C are schematic cross-sectional views taken along lines A-A' and B-B' of FIG. 1A, respectively.
Figure 1C:
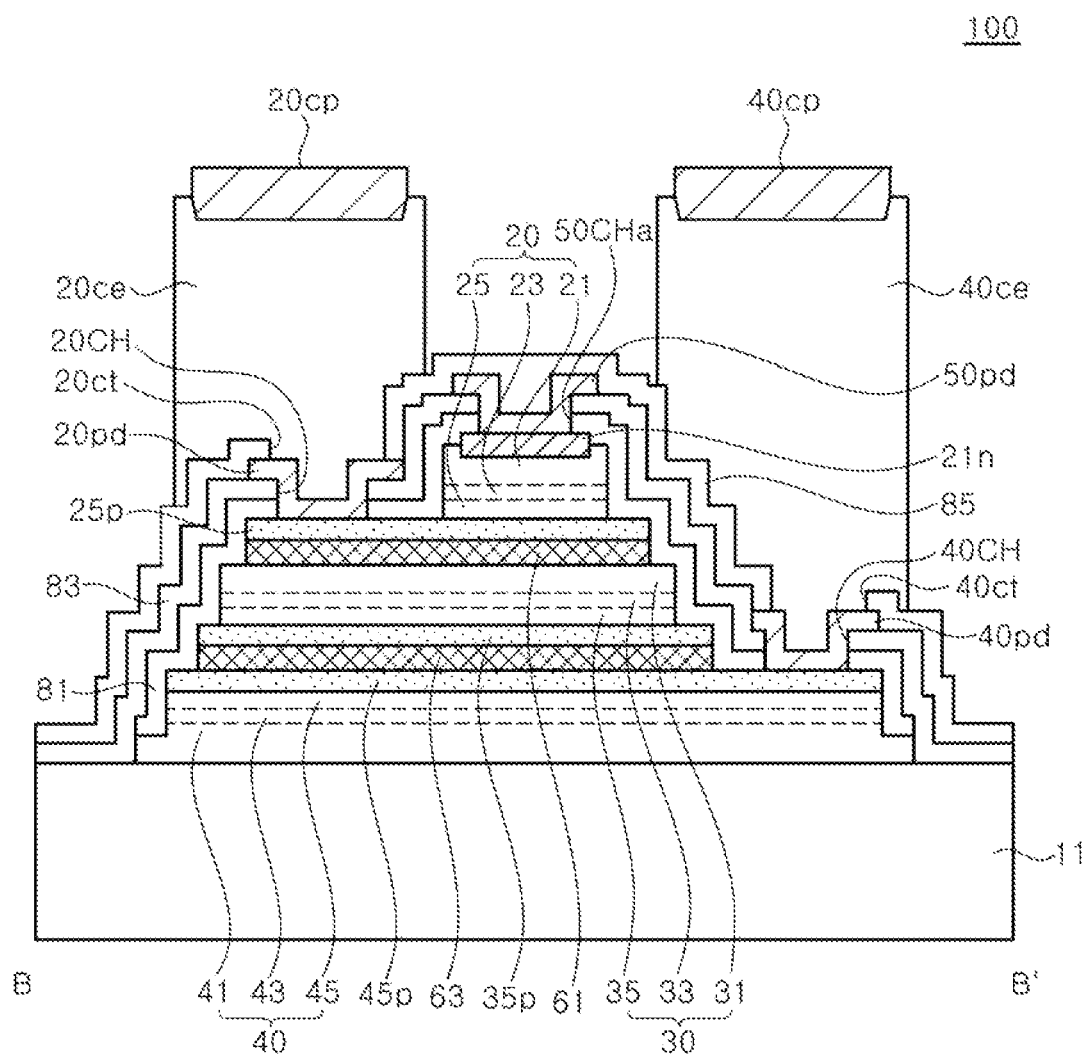

FIG. 1A is a schematic plan view of a light emitting device according to an exemplary embodiment, and FIG. 1B and FIG. 1C are schematic cross-sectional views taken along lines A-A' and B-B' of FIG. 1A, respectively.

Referring to FIGS. 1A, 1B, and 1C, a light emitting device 100 includes a light emitting stack structure, a first connection electrode 20*ce*, a second connection electrode 30*ce*, a third connection electrode 40*ce*, and a fourth connection electrode 50*ce* formed on the light emitting stack structure, and bonding metal layers 20*cp*, 30*cp*, 40*cp*, and 50*cp* disposed on the connection electrodes 20*ce*, 30*ce*, 40*ce*, and 50*ce*, respectively.

The light emitting device 100 may include a first LED sub-unit, a second LED sub-unit, and a third LED sub-unit disposed on a substrate 11. The first LED sub-unit may include a first light emitting stack 20, the second LED sub-unit may include a second light emitting stack 30, and the third LED sub-unit may include a third light emitting stack 40. The light emitting stack structure is exemplarily shown to include three light emitting stacks 20, 30, and 40, but the inventive concepts are not limited to a specific number of light emitting stacks. For example, in some exemplary embodiments, the light emitting stack structure may include two or more of light emitting stacks. Hereinafter, the light emitting device 100 will exemplarily be described as including three light emitting stacks 20, 30, and 40 according to an exemplary embodiment.

The substrate 11 may include a light-transmitting insulating material to transmit light. However, in some exemplary embodiments, the substrate 11 may be formed to be translucent or partially transparent so as to transmit only light of a specific wavelength or only a portion of light of a specific wavelength. The substrate 11 may be a growth substrate capable of epitaxially growing the third light emitting stack 40, for example, a sapphire substrate. However, the substrate 11 is not limited to the sapphire substrate, and may include various other transparent insulating materials. For example, the substrate 11 may include glass, quartz, silicon, an organic polymer, or an organic-inorganic composite material, for example, silicon carbide (SiC), gallium nitride (GaN), indium gallium nitride (InGaN), aluminum gallium nitride (AlGaN), aluminum nitride (AlN), gallium oxide ($Ga_2O_3$), or a silicon substrate. In addition, the substrate 11 may include irregularities on an upper surface thereof, and may be, for example, a patterned sapphire substrate. In this manner, the irregularities formed on the upper surface of the substrate 11 may improve extraction efficiency of light generated from the third light emitting stack 40 contacting the substrate 11. The irregularities of the substrate 11 may be included to selectively increase luminous intensity of the third light emitting stack 40 compared to those of the first light emitting stack 20 and the second light emitting stack 30. In some exemplary embodiments, the substrate 11 may be removed.

The first, second, and third light emitting stacks 20, 30, and 40 are configured to emit light toward the substrate 11. As such, light emitted from the first light emitting stack 20 may pass through the second and third light emitting stacks 30 and 40. According to an exemplary embodiment, the first, second, and third light emitting stacks 20, 30, and 40 may emit light having different peak wavelengths from one another. In an exemplary embodiment, a light emitting stack disposed further away from the substrate 11 emits light having a longer wavelength than that of light emitted from a light emitting stack disposed closer to the substrate 11, and thus, light loss may be reduced. For example, the first light emitting stack 20 may emit red light, the second light emitting stack 30 may emit green light, and the third light emitting stack 40 may emit blue light.

In another exemplary embodiment, to adjust a color mixing ratio of the first, second, and third light emitting stacks 20, 30, and 40, the second light emitting stack 30 may emit light of a shorter wavelength than that of the third light emitting stack 40. Accordingly, luminance intensity of the second light emitting stack 30 may be reduced, and luminance intensity of the third light emitting stack 40 may not be reduced, and thus, luminance intensity ratios of light emitted from the first, second, and third light emitting stacks may be substantially changed. For example, the first light emitting stack 20 may be configured to emit red light, the second light emitting stack 30 may be configured to emit blue light, and the third light emitting stack 40 may be configured to emit green light. As such, luminance intensity of blue light may be relatively reduced, and luminance intensity of green light may be relatively increased, and thus, luminance intensity ratios of red, green, and blue light may be easily adjusted to approach 3:6:1. Moreover, light emitting areas of the first, second, and third light emitting stacks 20, 30, and 40 may be about 10,000 $\mu m^2$ or less, and further, 4,000 $\mu m^2$, furthermore, 2,500 $\mu m^2$ or less. In addition, as the light emitting stack is disposed closer to the substrate 11, the emitting area may become larger, and luminance intensity of green light may be further increased by disposing the third light emitting stack 40 emitting green light closest to the substrate 11.

Hereinafter, although the second light emitting stack 30 will be exemplarily described as emitting light of a shorter wavelength than that of the third light emitting stack 40, it should be noted that the second light emitting stack 30 may emit light of a longer wavelength than that of the third light emitting stack 40, such as green light, in other exemplary embodiments.

The first light emitting stack 20 includes a first conductivity type semiconductor layer 21, an active layer 23, and a second conductivity type semiconductor layer 25. According to an exemplary embodiment, the first light emitting stack 20 may include a semiconductor material such as AlGaAs, GaAsP, AlGaInP, and GaP that emits red light, but the inventive concepts are not limited thereto.

A first upper contact electrode 21n may be disposed on the first conductivity type semiconductor layer 21 and may be in ohmic contact with the first conductivity type semiconductor layer 21. A first lower contact electrode 25p may be disposed under the second conductivity type semiconductor layer 25. According to an exemplary embodiment, a portion of the first conductivity type semiconductor layer 21 may be patterned and recessed, and the first upper contact electrode 21n may be disposed in the recessed region of the first conductivity type semiconductor layer 21 to increase an ohmic contact level. The first upper contact electrode 21n may have a single-layer structure or a multiple-layer structure, and may include Al, Ti, Cr, Ni, Au, Ag, Sn, W, Cu, or an alloy thereof, such as Au—Te alloy or Au—Ge alloy, but the inventive concepts are not limited thereto. In an exemplary embodiment, the first upper contact electrode 21n may have a thickness of about 100 nm, and may include metal having high reflectivity to increase light emission efficiency in a downward direction toward the substrate 11.

The second light emitting stack 30 includes a first conductivity type semiconductor layer 31, an active layer 33, and a second conductivity type semiconductor layer 35. According to an exemplary embodiment, the second light emitting stack 30 may include a semiconductor material such as GaN, InGaN, ZnSe that emits blue light, but the inventive concepts are not limited thereto. A second lower contact electrode 35p is disposed under the second conductivity type semiconductor layer 35 of the second light emitting stack 30.

The third light emitting stack 40 includes a first conductivity type semiconductor layer 41, an active layer 43, and a second conductivity type semiconductor layer 45. According to an exemplary embodiment, the third light emitting stack 40 may include a semiconductor material such as GaN, InGaN, GaP, AlGaInP, AlGaP, or the like that emits green light. A third lower contact electrode 45p is disposed on the second conductivity type semiconductor layer 45 of the third light emitting stack 40.

According to an exemplary embodiment, each of the first conductivity type semiconductor layers 21, 31, and 41 and the second conductivity type semiconductor layers 25, 35, and 45 of the first, second, and third light emitting stacks 20, 30, and 40 may have a single-layer structure or a multiple-layer structure, and in some exemplary embodiments, may include a superlattice layer. Moreover, the active layers 23, 33, and 43 of the first, second, and third light emitting stacks 20, 30, and 40 may have a single-quantum well structure or a multiple-quantum well structure.

Each of the first, second, and third lower contact electrodes 25*p*, 35*p*, and 45*p* may include a transparent conductive material that transmits light. For example, the lower contact electrodes 25*p*, 35*p*, and 45*p* may include transparent conductive oxide (TCO) such as SnO, $InO_2$, ZnO, ITO, ITZO, or the like, without being limited thereto. In this manner, current may be evenly spread to the first, second, and third light emitting stacks 20, 30, and 40 by the first, second, and third lower contact electrodes 25*p*, 35*p*, and 45*p*.

A first adhesive layer 61 is disposed between the first light emitting stack 20 and the second light emitting stack 30, and a second adhesive layer 63 is disposed between the second light emitting stack 30 and the third light emitting stack 40. The first and second adhesive layers 61 and 63 may include a non-conductive material that transmits light. For example, the first and second adhesive layers 61 and 63 may include an optically transparent adhesive (OCA), for example, epoxy, polyimide, SUB, spin-on-glass (SOG), or benzocyclobutene (BCB), but the inventive concepts are not limited thereto.

According to the illustrated exemplary embodiment, a first insulation layer 81, a second insulation layer 83, and a third insulation layer 85 are disposed on at least portions of side surfaces of the first, second, and third light emitting stacks 20, 30, and 40. At least one of the first, second, and third insulation layers 81, 83, and 85 may include various organic or inorganic insulating materials, such as polyimide, $SiO_2$, $SiN_x$, $Al_2O_3$, or the like. For example, at least one of the first, second, and third insulation layers 81, 83, and 85 may include a distributed Bragg reflector (DBR). As another example, at least one of the first, second, and third insulation layers 81, 83, and 85 may include a black organic polymer. In some exemplary embodiments, an electrically floating metal reflection layer is disposed on the first, second, and third insulation layers 81, 83, and 85, and may reflect light emitted from the light emitting stacks 20, 30, and 40 toward the substrate 11. In some exemplary embodiments, at least one of the first, second, and third insulation layers 81, 83, and 85 may have a single-layer structure or a multiple-layer structure formed of two or more insulation layers having different refractive indices.

According to an exemplary embodiment, each of the first, second, and third light emitting stacks 20, 30, and 40 may be driven independently. More specifically, a common voltage may be applied to one of the first and second conductivity type semiconductor layers of each of the light emitting stacks, and an individual emission signal may be applied to the remaining one of the first and second conductivity type semiconductor layers of each of the light emitting stacks. For example, according to an exemplary embodiment, the first conductivity type semiconductor layers 21, 31, and 41 of each of the light emitting stacks 20, 30, and 40 may be n-type, and the second conductivity type semiconductor layers 25, 35, and 45 of each of the light emitting stacks 20, 30, and 40 may be p-type. In this case, the third light emitting stack 40 may have a stacked sequence that is opposite to those of the first light emitting stack 20 and the second light emitting stack 30, and thus, the p-type semiconductor layer 45 may be disposed on the active layer 43 to simplify processes of manufacturing the light emitting device 100. Hereinafter, according to the illustrated exemplary embodiment, the first conductivity type and the second conductivity type semiconductor layers will be described as n-type and p-type, respectively. However, in some exemplary embodiments, n-type and p-type may be reversed.

Each of the first, second, and third lower contact electrodes 25*p*, 35*p*, and 45*p* that are connected to the p-type semiconductor layers 25, 35, and 45 of the light emitting stacks, respectively, may be electrically connected to the first, second, and third connection electrodes 20*ce*, 30*ce*, and 40*ce* to receive corresponding emission signals, respectively. Meanwhile, the n-type semiconductor layers 21, 31, and 41 of the light emitting stacks may be commonly electrically connected to the fourth connection electrode 50*ce*. As such, the light emitting device 100 may have a common n-type light emitting stack structure in which the n-type semiconductor layers 21, 31, and 41 of the first, second, and third light emitting stacks 20, 30, and 40 are commonly connected, and thus, the first, second, and third light emitting stacks 20, 30, and 40 may be driven independently from one another. Since the light emitting device 100 has the common n-type light emitting structure, sources of voltages applied to the first, second, and third light emitting stacks 20, 30, and 40 may be set to be different from one another.

The light emitting device 100 according to the illustrated exemplary embodiment has the common n-type structure, but the inventive concepts are not limited thereto. For example, in some exemplary embodiments, the first conductivity type semiconductor layers 21, 31, and 41 of each of the light emitting stacks may be p-type, and the second conductivity type semiconductor layer 25, 35, and 45 of each of the light emitting stacks may be n-type, and thus, a common p-type light emitting stack structure may be formed. In addition, in some exemplary embodiments, the stacked sequence of each of the light emitting stacks is not limited to that shown in the drawing, but may be variously modified. Hereinafter, the light emitting device 100 will exemplarily be described as having the common n-type light emitting stack structure.

According to the illustrated exemplary embodiment, the light emitting device 100 includes a first pad 20*pd*, a second pad 30*pd*, a third pad 40*pd*, and a fourth pad 50*pd*. The first pad 20*pd* is electrically connected to the first lower contact electrode 25*p* through a first contact hole 20CH defined through the first and second insulation layers 81 and 83. The first connection electrode 20*ce* is electrically connected to the first pad 20*pd* through a first through hole 20*ct* defined through the third insulation layer 85. The second pad 30*pd* is electrically connected to the second lower contact electrode 35*p* through a second contact hole 30CH defined through the first and second insulation layers 81 and 83. The second connection electrode 30*ce* is electrically connected to the second pad 30*pd* through a second through hole 30*ct* defined through the second insulation layer 83.

The third pad 40*pd* is electrically connected to the third lower contact electrode 45*p* through the third contact hole 40CH defined through the first and second insulation layers 81 and 83. The third connection electrode 40*ce* is electrically connected to the third pad 40*pd* through a third through hole 40*ct* defined through the second insulation layer 83. The fourth pad 50*pd* is connected to the first conductivity type semiconductor layers 21, 31, and 41 of the first, second, and third light emitting stacks 20, 30, and 40 through a first sub-contact hole 50CHa, a second sub-contact hole 50CHb, and a third sub-contact hole 50CHc defined on the first conductive type semiconductor layers 21, 31, and 41 of the first, second, and third light emitting stacks 20, 30, and 40. In particular, the first sub-contact hole 50CHa may expose the first upper contact electrode 21n, and the fourth pad 50pd may be connected to the first upper contact electrode 21n through the first sub-contact hole 50CHa. In this manner, the fourth pad 50pd can be electrically connected to the first conductivity type semiconductor layers 21, 31, and 41 through the sub-contact holes 50CHa, 50CHb, and 50CHc, so that a manufacturing process of the light emitting device 100 may be simplified. The fourth connection electrode 50ce is electrically connected to the fourth pad 50pd through a fourth through hole 50ct defined through the second insulation layer 83.

In the illustrated exemplary embodiment, although each of the connection electrodes 20ce, 30ce, 40ce, and 50ce are shown and described as directly contacting the pads 20pd, 30pd, 40pd, and 50pd, in some exemplary embodiments, the connection electrodes 20ce, 30ce, 40ce, and 50ce may not be directly connected to the pads 20pd, 30pd, 40pd, and 50pd, and another connector may be interposed therebetween.

The first, second, third, and fourth pads 20pd, 30pd, 40pd, and 50pd are spaced apart from one another and insulated. According to an exemplary embodiment, each of the first, second, third, and fourth pads 20pd, 30pd, 40pd, and 50pd may cover at least portions of side surfaces of the first, second, and third light emitting stacks 20, 30, and 40. In this manner, heat generated from the first, second, and third light emitting stacks 20, 30, and 40 may be easily dissipated to the outside.

According to the illustrated exemplary embodiment, each of the connection electrodes 20ce, 30ce, 40ce, and 50ce may have a substantially elongated shape that protrudes upward from the substrate 11. The connection electrodes 20ce, 30ce, 40ce, and 50ce may include metal such as Cu, Ni, Ti, Sb, Zn, Mo, Co, Sn, Ag, or an alloy thereof, but the inventive concepts are not limited thereto. For example, each of the connection electrodes 20ce, 30ce, 40ce, and 50ce may include two or more metals or a plurality of different metal layers to reduce stress from the elongated shape of the connection electrodes 20ce, 30ce, 40ce, and 50ce. The connection electrodes 20ce, 30ce, 40ce, and 50ce may be formed of, for example, Cu which facilitate deposition using plating at low cost. Cu forms a natural oxide film, which can be removed by flux in a solder paste in a surface mounting technology using the solder paste. However, in the surface mounting technology using the solder paste, when a distance between the connection electrodes 20ce, 30ce, 40ce, and 50ce is less than about 50 μm, an electrical short may occur between the solder paste. As such, the surface mounting technology may not be feasible for mounting the light emitting device 100.

As a method to bond extremely small light emitting devices such as micro LEDs, eutectic bonding technology may be used. However, the natural oxide film on Cu may prevent the eutectic bonding and cause bonding failure.

As such, according to an exemplary embodiment, the bonding metal layers 20cp, 30cp, 40cp, and 50cp are disposed on the connection electrodes 20ce, 30ce, 40ce, and 50ce, respectively. Each of the connection electrodes 20ce, 30ce, 40ce, and 50ce may have a recessed region on an upper surface thereof, and the bonding metal layers 20cp, 30cp, 40cp, and 50cp may be disposed in the recessed regions of the connection electrodes 20ce, 30ce, 40ce and 50ce to protrude to the outside, respectively The bonding metal layers 20cp, 30cp, 40cp, and 50cp may be electrically connected to the connection electrodes 20ce, 30ce, 40ce, and 50ce, respectively. The bonding metal layers 20cp, 30cp, 40cp, and 50cp may be formed of, for example, Au, which can be bonded to a circuit board through eutectic bonding. In this case, a pad disposed on the circuit board may include, for example, In or Sn. The bonding metal layers 20cp, 30cp, 40cp, and 50cp may be formed of In or Sn. However, In is difficult to deposit thick through plating technology, and Sn is difficult to probe to measure electrical characteristics of the light emitting device 100. As such, by forming the bonding metal layers 20cp, 30cp, 40cp, and 50cp with Au, a bonding metal layer having a sufficient thickness may be formed, and further, electrical characteristics of the light emitting device 100 may be easily measured.

In some exemplary embodiments, a barrier layer may be interposed between the connection electrodes 20ce, 30ce, 40ce, and 50ce and the bonding metal layers 20cp, 30cp, 40cp, and 50cp. The barrier layer prevents the bonding metal layers 20cp, 30cp, 40cp, and 50cp from being mixed with the connection electrodes 20ce, 30ce, 40ce, and 50ce. This will be described in more detail again later.

When the light emitting device 100 according to an exemplary embodiment includes a micro LED having a surface area of about 10,000 $\mu m^2$ or less, or about 4,000 $\mu m^2$ or less, or about 2,500 $\mu m^2$ or less as known in the art, the connection electrodes 20ce, 30ce, 40ce, and 50ce may be overlapped with at least a portion of one of the first, second, and third light emitting stacks 20, 30, and 40 as shown in the drawing. More specifically, the connection electrodes 20ce, 30ce, 40ce, and 50ce may be overlapped with at least one step that is formed on the side surface of the light emitting stack structure. As such, a lower surface of the connection electrode may provide a larger contact area than that of an upper surface thereof, and thus, the connection electrodes 20ce, 30ce, 40ce, and 50ce may be more stably formed on the light emitting stack structure than those of a conventional light emitting device.

In some exemplary embodiments, at least one of the connection electrodes 20ce, 30ce, 40ce, and 50ce may be overlapped with the side surface of each of the light emitting stacks 20, 30, and 40, and thus, the light emitting stacks 20, 30, and 40 may efficiently dissipate heat generated from inside thereof to the outside. Further, when the connection electrodes 20ce, 30ce, 40ce, and 50ce include a reflective material such as metal, the connection electrodes 20ce, 30ce, 40ce, and 50ce may reflect light that is emitted from at least one or more of the light emitting stacks 20, 30, and 40, and thus, luminous efficiency may be improved.

Figure 2:
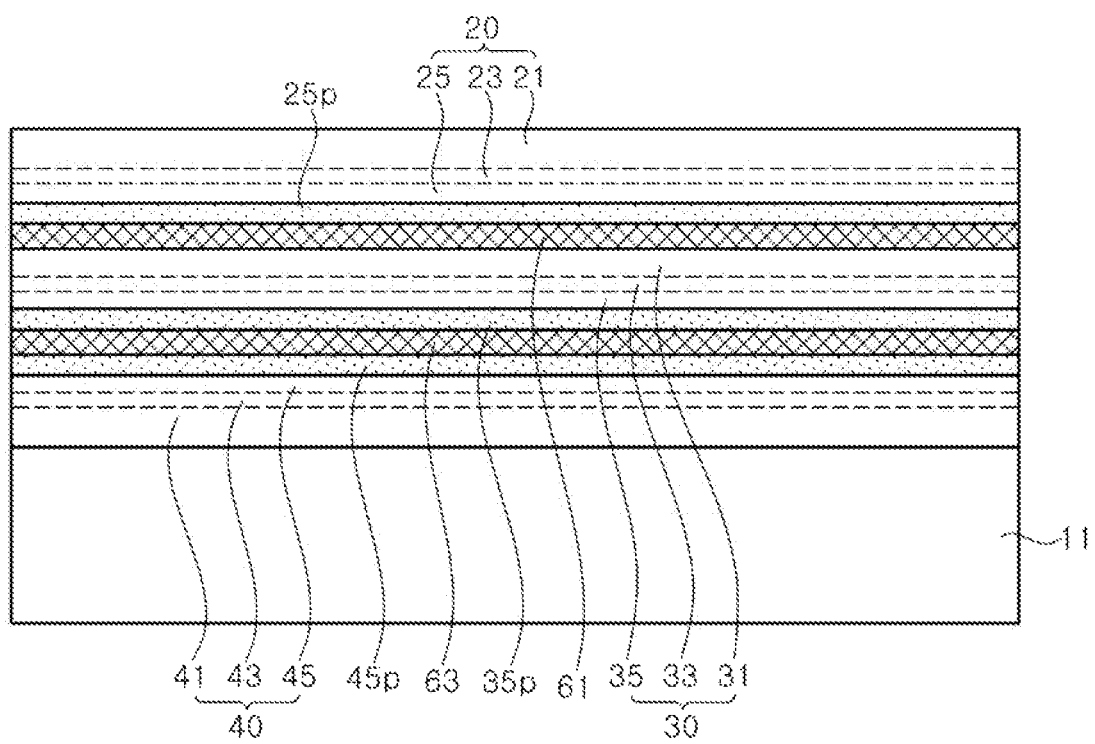
FIG. 2 is a schematic cross-sectional view of a light emitting stack structure according to an exemplary embodiment.

FIG. 2 is a schematic cross-sectional view of a light emitting stack structure according to an exemplary embodiment. The above-described light emitting device 100 is formed by processing the light emitting stack structure.

Referring to FIG. 2, the light emitting stack structure includes a substrate 11, a first light emitting stack 20, a second light emitting stack 30, and a third light emitting stack 40. In addition, lower contact electrodes 25p, 35p, and 45p may be disposed on second conductivity type semiconductor layers 25, 35, and 45 of the light emitting stacks 20, 30, and 40, respectively.

A first conductivity type semiconductor layer 41, a third active layer 43, and a second conductivity type semiconductor layer 45 of the third light emitting stack 40 may be sequentially grown on a substrate 11 by, for example, a metal organic chemical vapor deposition (MOCVD) method or a molecular beam epitaxy (MBE) method. The third lower contact electrode 45p may be formed on the second conductivity type semiconductor layer 45 by, for example, a physical vapor deposition or chemical vapor deposition method, and may include transparent conductive oxide (TCO), such as SnO, $InO_2$, ZnO, ITO, ITZO, or the like. When the third light emitting stack 40 emits green light according to an exemplary embodiment, the substrate 11 may include $Al_2O_3$ (for example, a sapphire substrate), and the third lower contact electrode 45p may include transparent conductive oxide (TCO), such as tin oxide. The first and second light emitting stacks 20 and 30 may be similarly formed by sequentially growing a first conductivity type semiconductor layer, an active layer, and a second conductivity type semiconductor layer on a temporary substrate. Lower contact electrodes including transparent conductive oxide (TCO) may be formed by, for example, a physical vapor deposition or a chemical vapor deposition method on the second conductivity type semiconductor layer, respectively.

In an exemplary embodiment, the first light emitting stack 20 may be attached to the second light emitting stack 30 through a first adhesive layer 61, and the second light emitting stack 30 may be attached to the third light emitting stack 40 through a second adhesive layer 63. For example, after the third light emitting stack 40 is grown on the substrate 11, the second light emitting stack 30 grown on the temporary substrate may be attached to the third light emitting stack 40 through the second adhesive layer 63. The temporary substrate on the second light emitting stack 30 may then be removed. Subsequently, the first light emitting stack 20 grown on another temporary substrate may be attached on the second light emitting stack 30 through the first adhesive layer 61. The temporary substrate on the first light emitting stack 20 may be removed from the first light emitting stack 20.

In another exemplary embodiment, the first and second light emitting stacks 20 and 30 may be bonded to each other with the first adhesive layer 61 interposed therebetween, and at least one of the temporary substrates of the first and second light emitting stacks 20 and 30 may be removed by a laser lift-off process, a chemical process, a mechanical process, or the like. Further, the first and second light emitting stacks 20 and 30 may be coupled to the third light emitting stack 40 with the second adhesive layer 63 interposed therebetween, and the remaining temporary substrate of the first and second light emitting stacks 20 and 30 may be removed by the laser lift-off process, the chemical process, the mechanical process, or the like.

Since the first, second, and third light emitting stacks 20, 30, and 40, the first, second, and third lower contact electrodes 25p, 35p, and 45p, and the adhesive layers 61 and 63 are the same as described above, repeated detailed descriptions thereof will be omitted to avoid redundancy.

Hereinafter, a method of manufacturing the light emitting device 100 using the light emitting stack structure of FIG. 2 will be described in more detail.

FIGS. 3A, 4A, 5A, 6A, 7A, 8A, 9A, 10A, 11A, 12A, 13A, and 14A are plan views illustrating a process of manufacturing a light emitting device according to an exemplary embodiment. FIGS. 3B, 4B, 5B, 6B, 7B, 8B, 9B, 10B, 11B, 12B, 13B, and 14B are schematic cross-sectional views taken along line A-A' of the corresponding plan views shown in FIGS. 3A, 4A, 5A, 6A, 7A, 8A, 9A, 10A, 11A, 12A, 13A, and 14A, respectively. FIGS. 3C, 4C, 5C, 6C, 7C, 8C, 9C, 10C, 11C, 12C, 13C, and 14C are schematic cross-sectional views taken along line B-B' of the corresponding plan views shown in FIGS. 3A, 4A, 5A, 6A, 7A, 8A, 9A, 10A, 11A, 12A, 13A, and 14A, respectively.

Figure 3A:
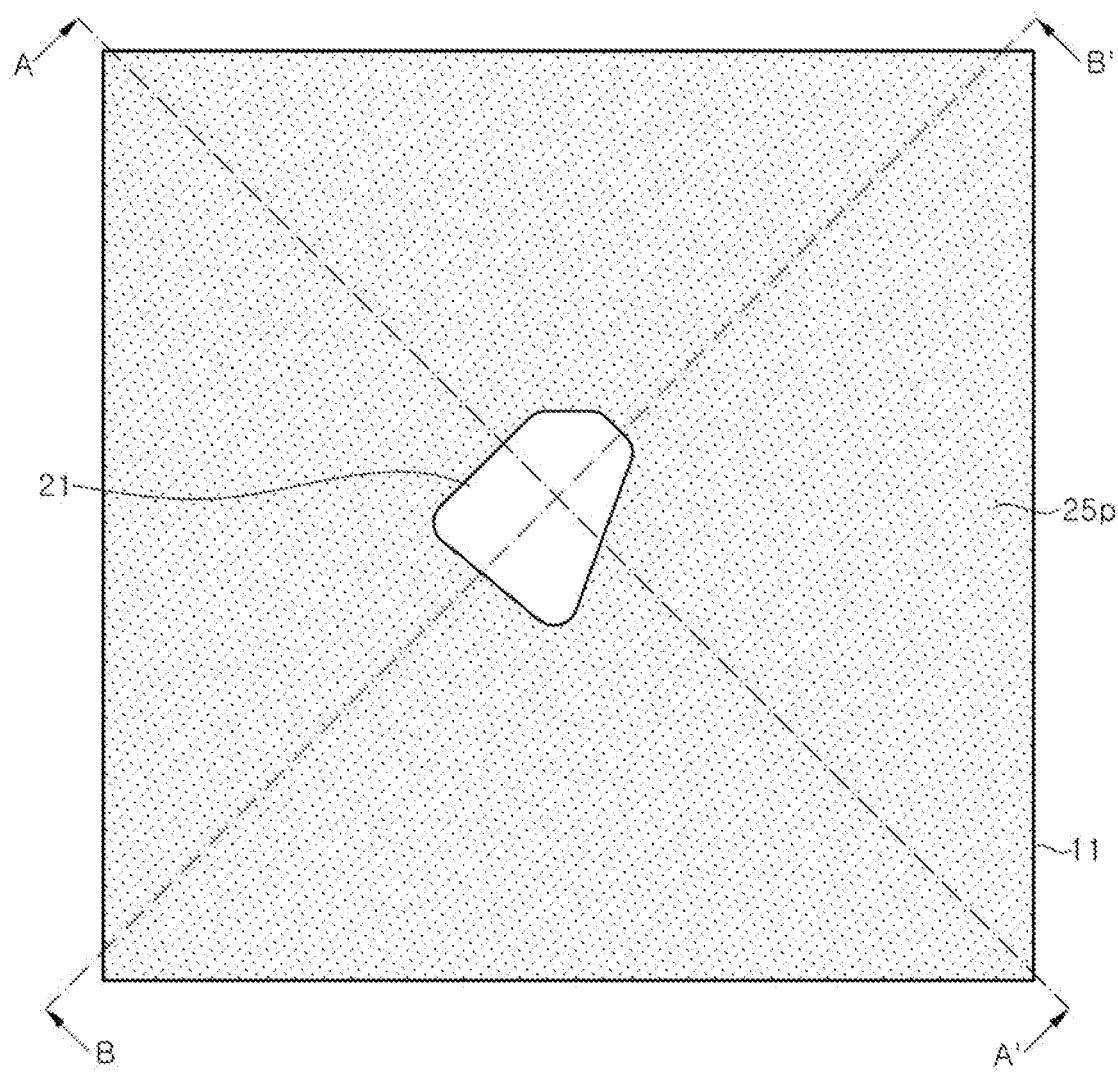
FIGS. 3A, 4A, 5A, 6A, 7A, 8A, 9A, 10A, 11A, 12A, 13A, and 14A are plan views illustrating a process of manufacturing a light emitting device according to an exemplary embodiment.
Figure 3B:
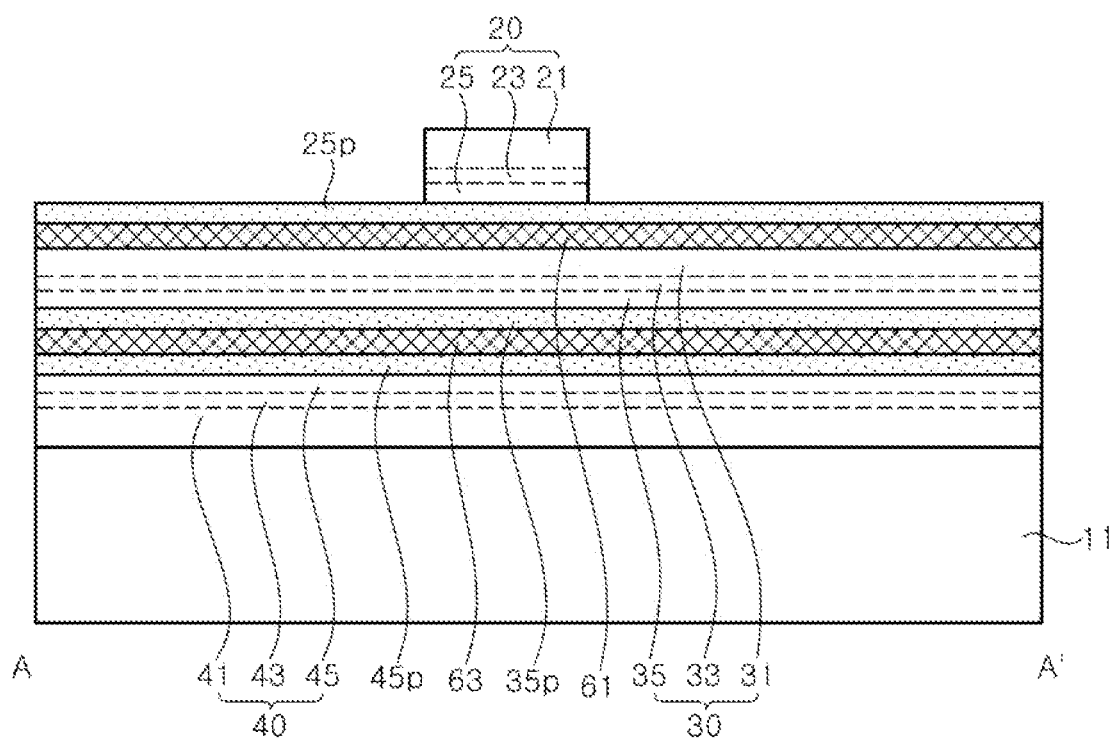
FIGS. 3B, 4B, 5B, 6B, 7B, 8B, 9B, 10B, 11B, 12B, 13B, and 14B are schematic cross-sectional views taken along line A-A' of FIGS. 3A, 4A, 5A, 6A, 7A, 8A, 9A, 10A, 11A, 12A, 13A, and 14A, respectively.
Figure 3C:
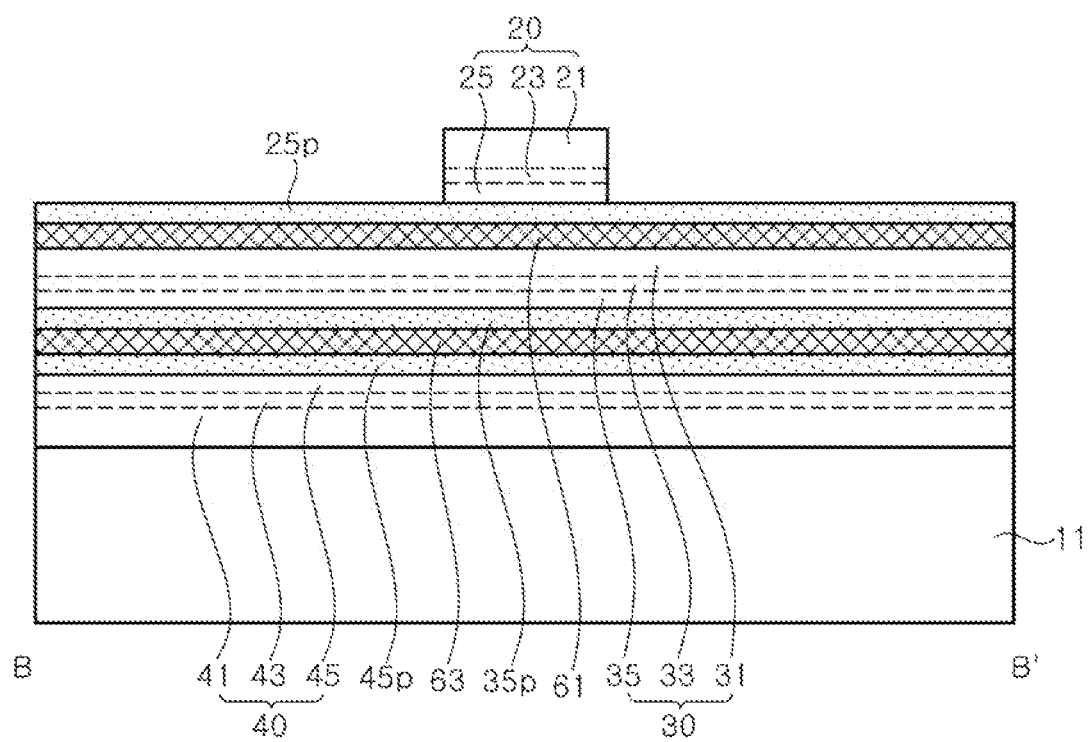
FIGS. 3C, 4C, 5C, 6C, 7C, 8C, 9C, 10C, 11C, 12C, 13C, and 14C are schematic cross-sectional views taken along line B-B' of FIGS. 3A, 4A, 5A, 6A, 7A, 8A, 9A, 10A, 11A, 12A, 13A, and 14A, respectively.

Referring to FIGS. 3A, 3B, and 3C, the first lower contact electrode 25p is exposed by patterning the first conductivity type semiconductor layer 21, the active layer 23, and the second conductivity type semiconductor layer 25. The first conductivity type semiconductor layer 21, the active layer 23, and the second conductivity type semiconductor layer 25 may be patterned using photolithography and etching processes. The photolithography process may be carried out using a first mask, and for example, the first conductivity type semiconductor layer 21, the active layer 23, and the second conductivity type semiconductor layer 25 may be etched using a dry etching technique. After patterning, the first light emitting stack 20 may be surrounded by the exposed lower contact electrode 25p. Although one first light emitting stack 20 is exemplarily shown in the drawings, the first light emitting stack 20 may be patterned in each light emitting device region of the substrate 11.

The first light emitting stack 20 may be disposed in a central portion of the light emitting device region, but the inventive concepts are not limited thereto. A planar shape of the first light emitting stack 20 may have an elongated shape along one diagonal direction, but the inventive concepts are not limited thereto.

The first lower contact electrode 25p may be a transparent electrode, and the second conductivity type semiconductor layer 25 may be a p-type semiconductor layer. The first conductivity type semiconductor layer 21 may be disposed on an upper surface of the first light emitting stack 20, and the first conductivity type semiconductor layer 21 may be an n-type semiconductor layer.

Figure 4A:
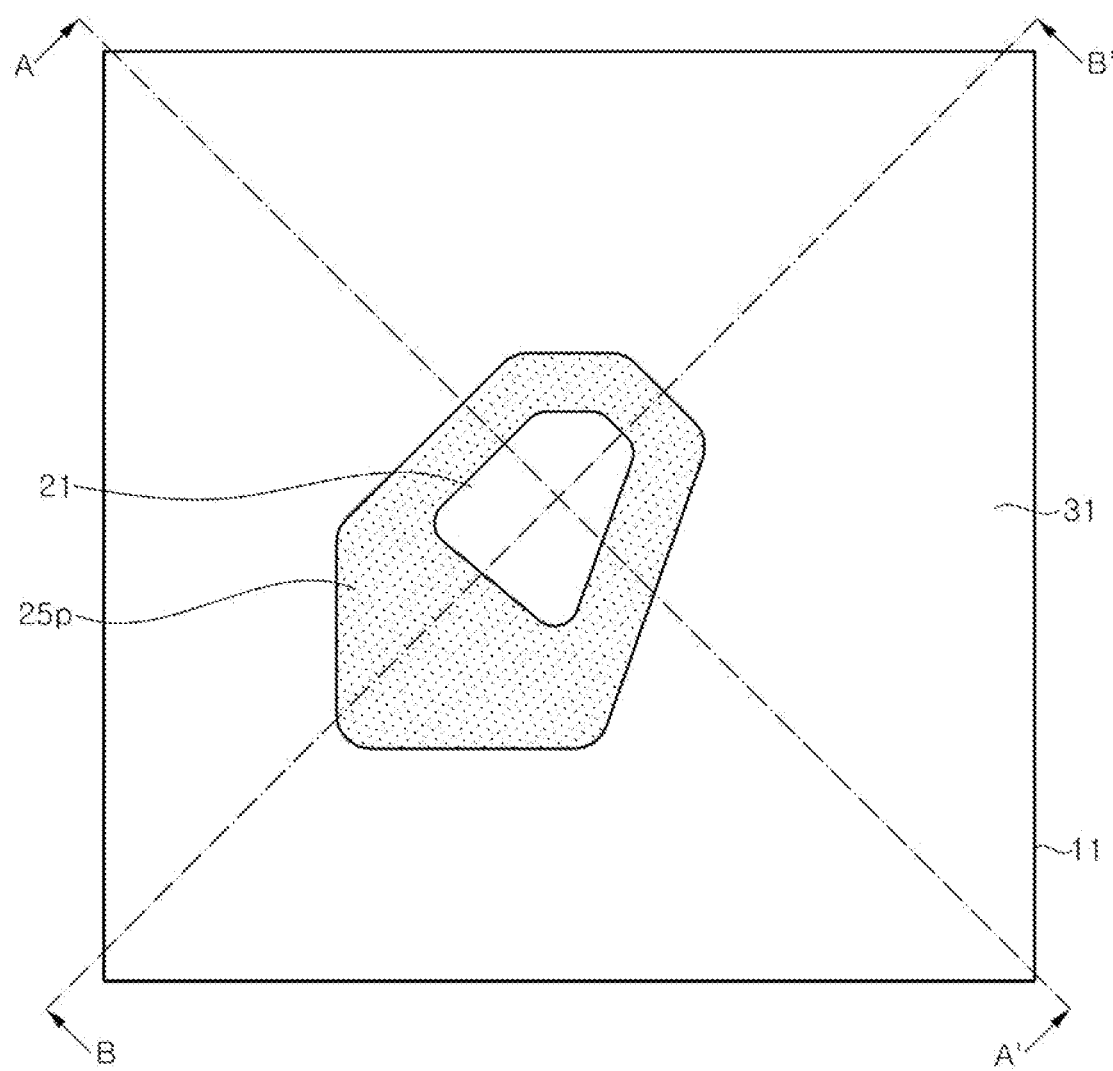
Figure 4B:
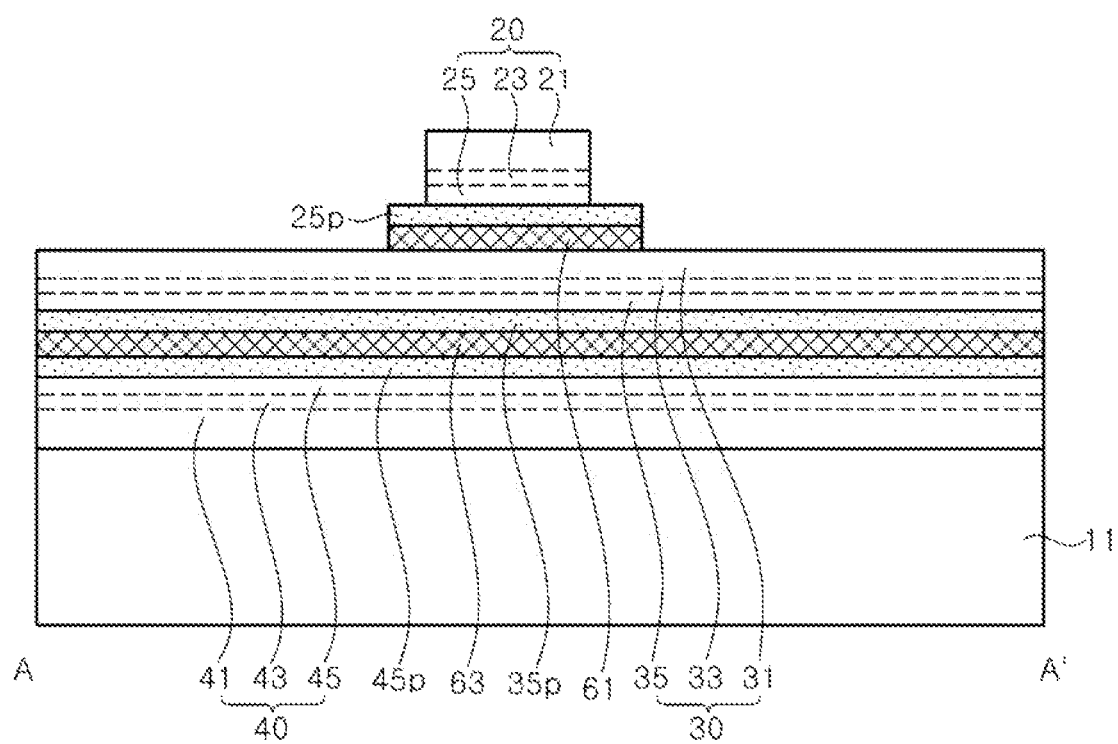
Figure 4C:
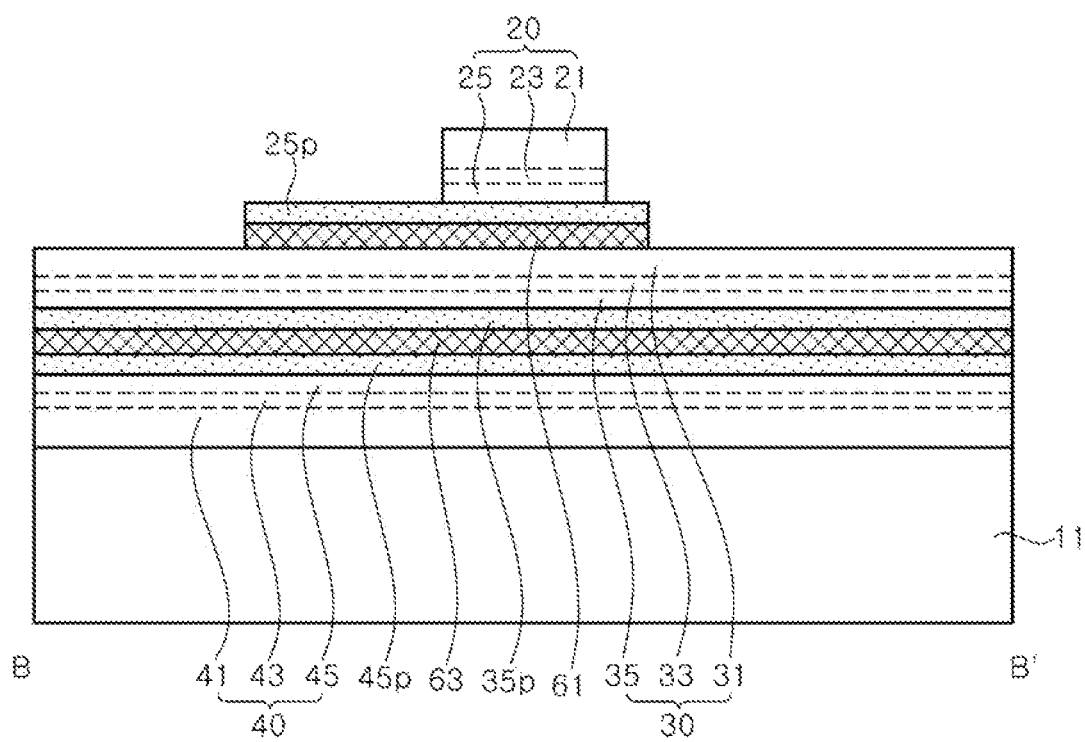

Referring to FIGS. 4A, 4B, and 4C, the first lower contact electrode 25p is patterned so that a portion of the first lower contact electrode 25p surrounds the first light emitting stack 20. The first lower contact electrode 25p may be patterned using a second mask. In this case, the first adhesive layer 61 may also be patterned together. Accordingly, the first conductivity type semiconductor layer 31 may be exposed around the first lower contact electrode 25p.

Figure 5A:
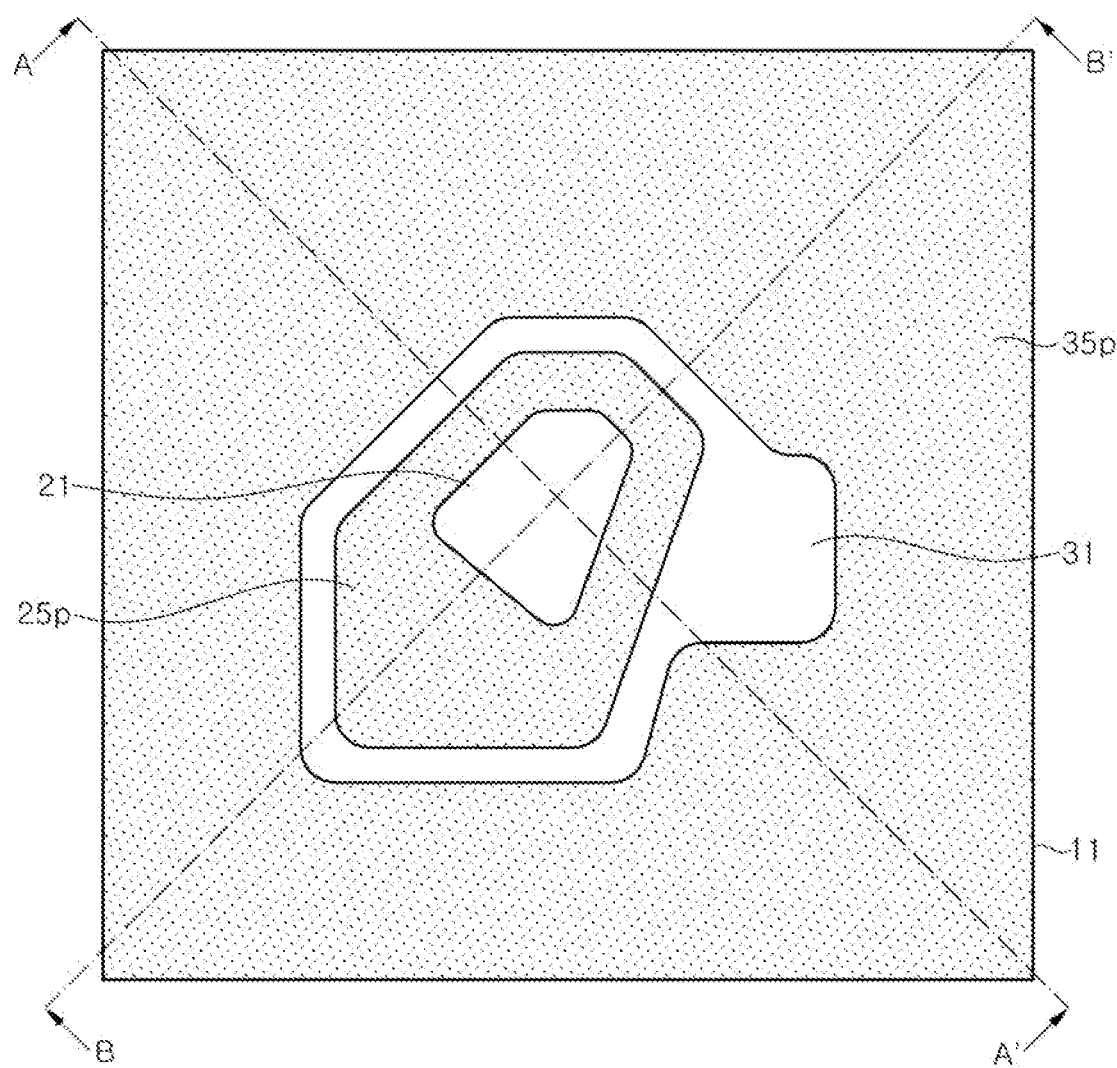
Figure 5B:
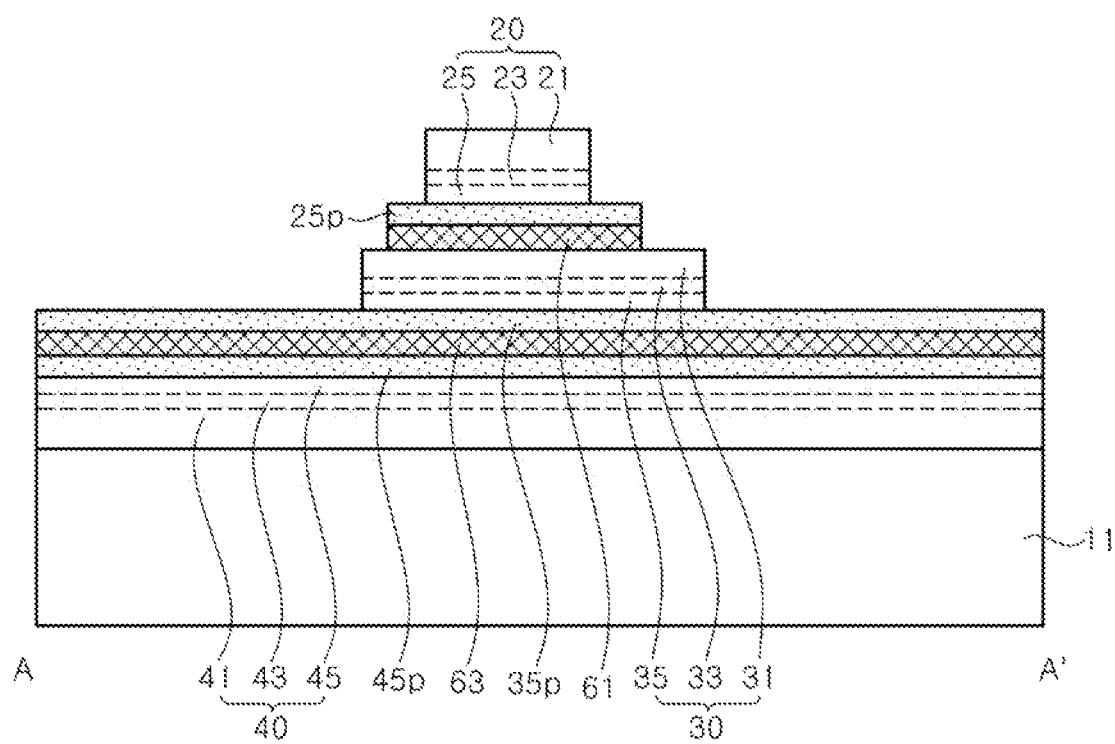
Figure 5C:
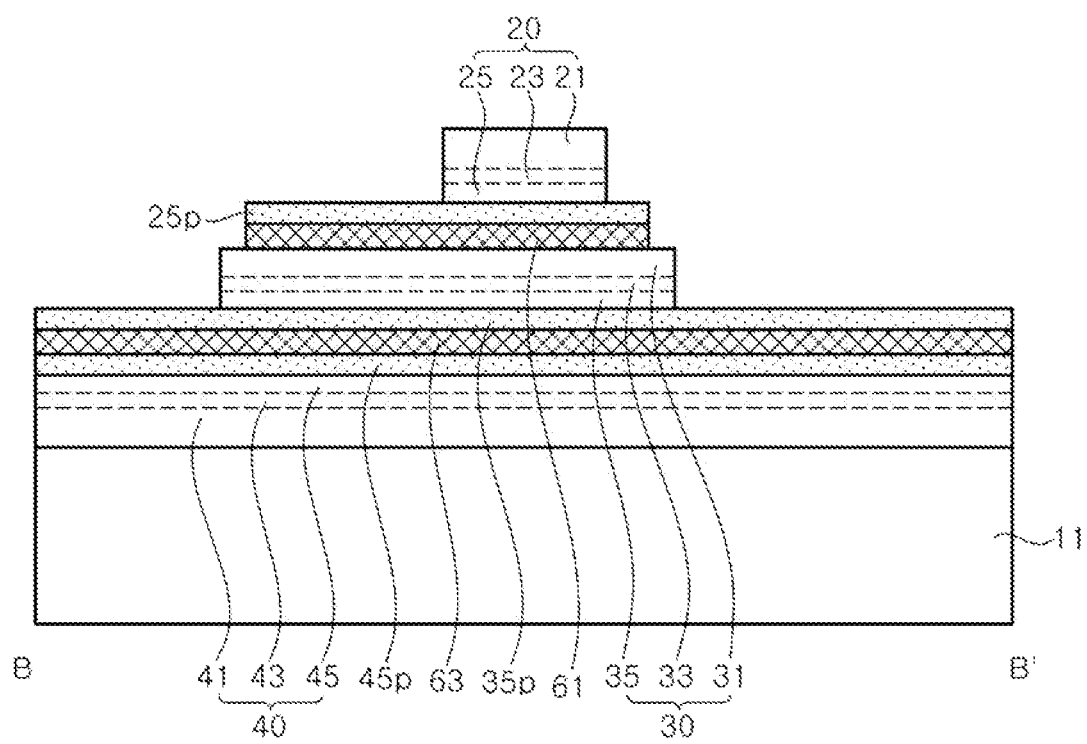

Referring to FIGS. 5A, 5B, and 5C, the second lower contact electrode 35p is exposed by patterning the first conductivity type semiconductor layer 31, the active layer 33, and the second conductivity type semiconductor layer 35. The first conductivity type semiconductor layer 31, the active layer 33, and the second conductivity type semiconductor layer 35 may be patterned using photolithography and etching processes. The photolithography process may be carried out using a third mask, and for example, the first conductivity type semiconductor layer 31, the active layer 33, and the second conductivity type semiconductor layer 35 may be etched using a dry etching technique. After patterning, the second light emitting stack 30 is surrounded by the exposed second lower contact electrode 35p.

Figure 6A:
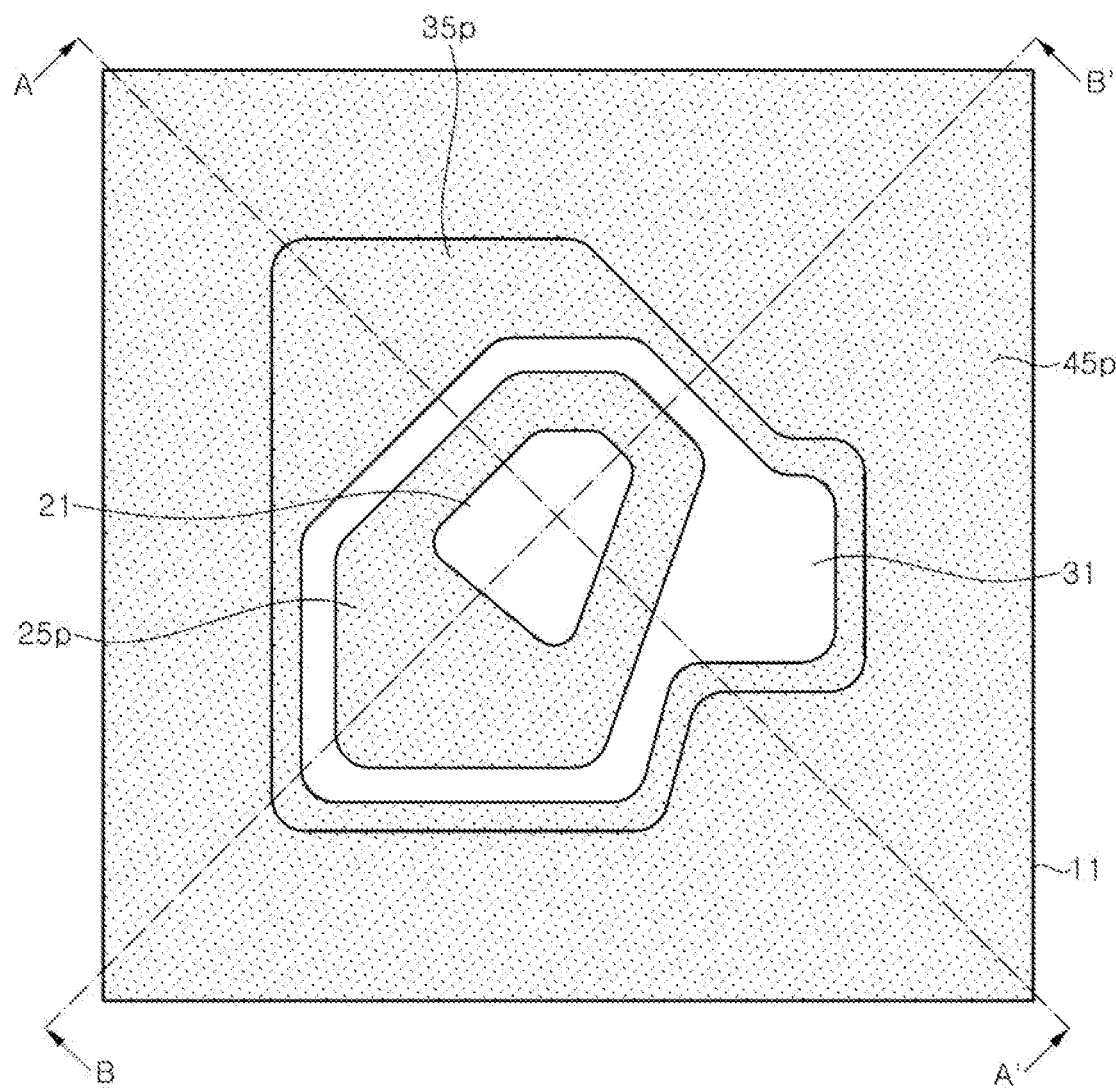
Figure 6B:
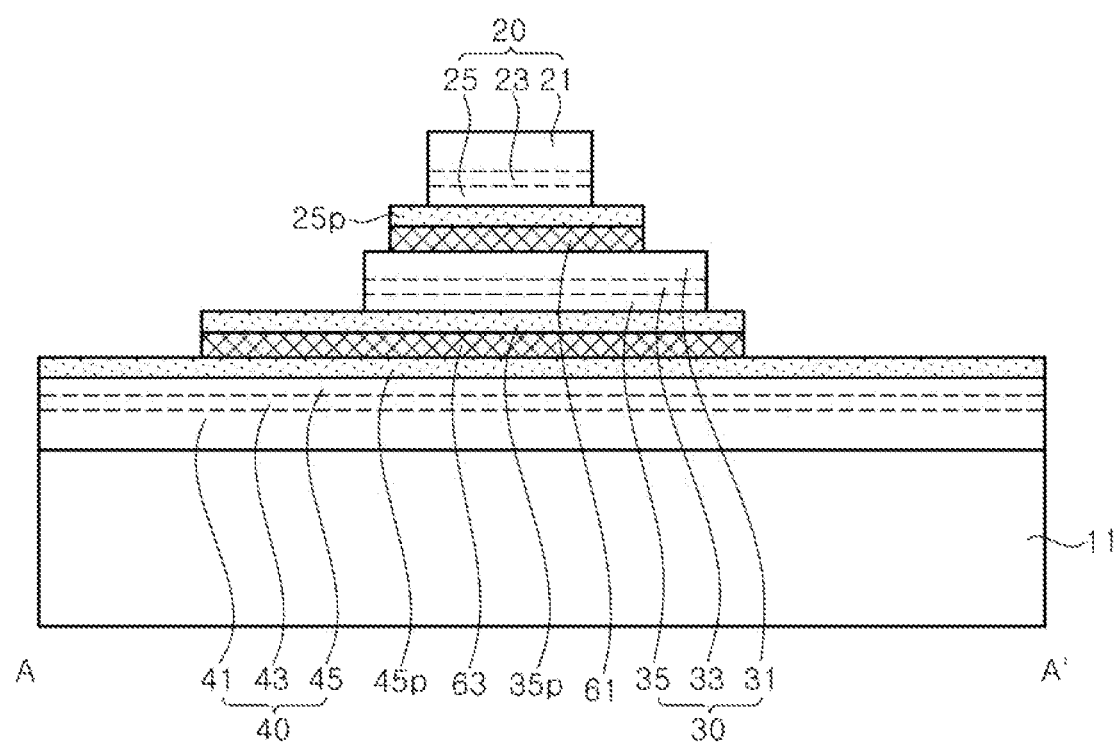
Figure 6C:
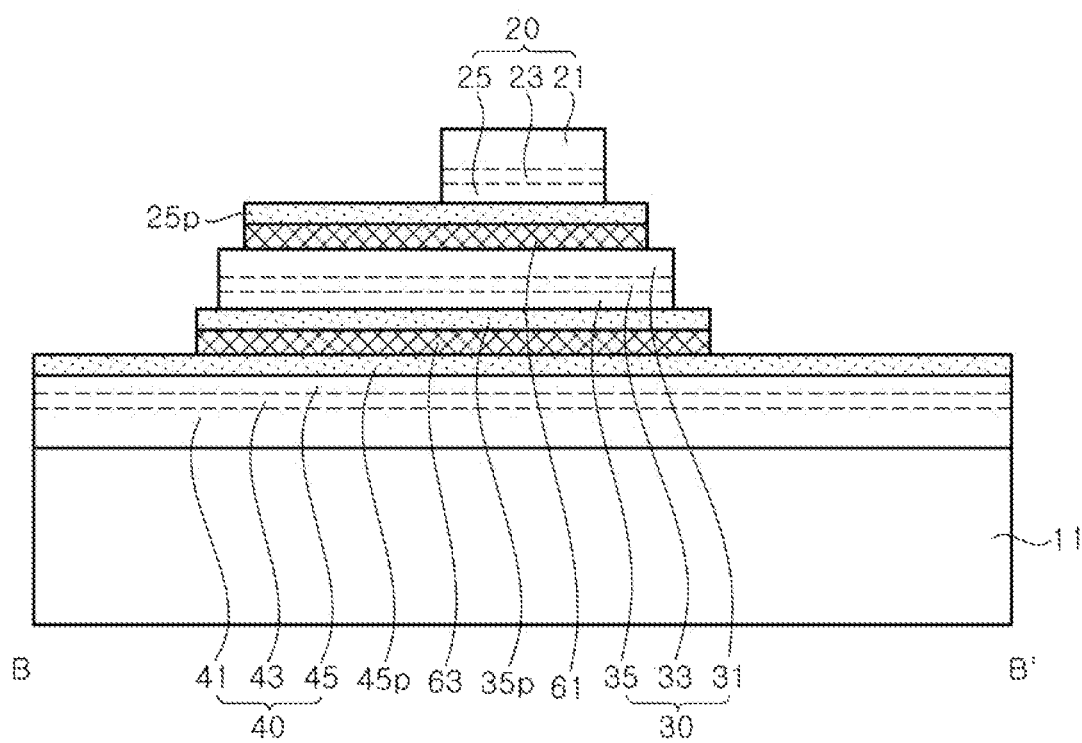

Referring to FIGS. 6A, 6B, and 6C, the second lower contact electrode 35p is patterned so that a portion of the second lower contact electrode 35p surrounds the second light emitting stack 30. The second lower contact electrode 35p may be patterned using a fourth mask. In this case, the second adhesive layer 63 may also be patterned together. Accordingly, the third lower contact electrode 45p may be exposed around the second lower contact electrode 35p.

Figure 7A:
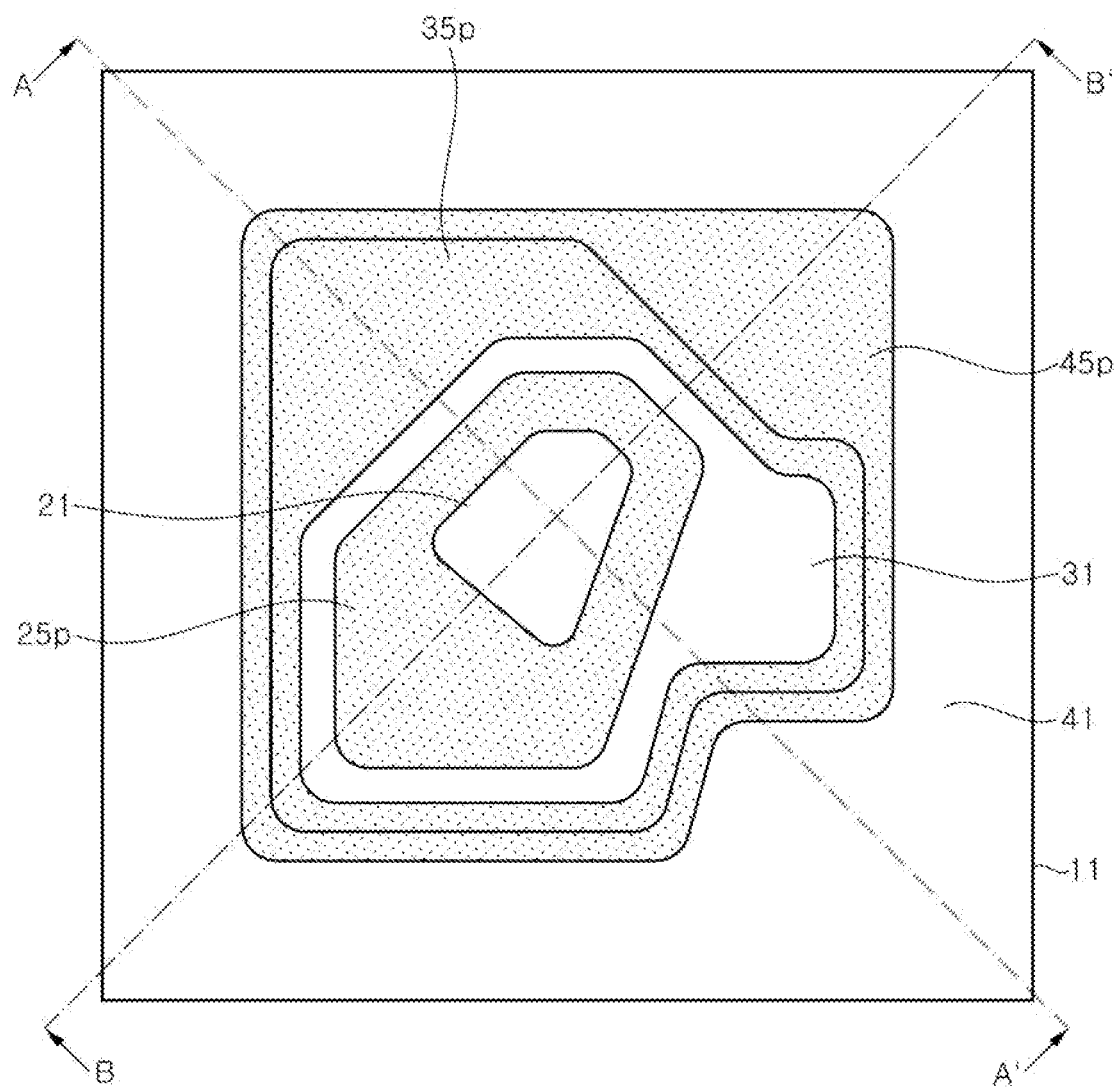
Figure 7B:
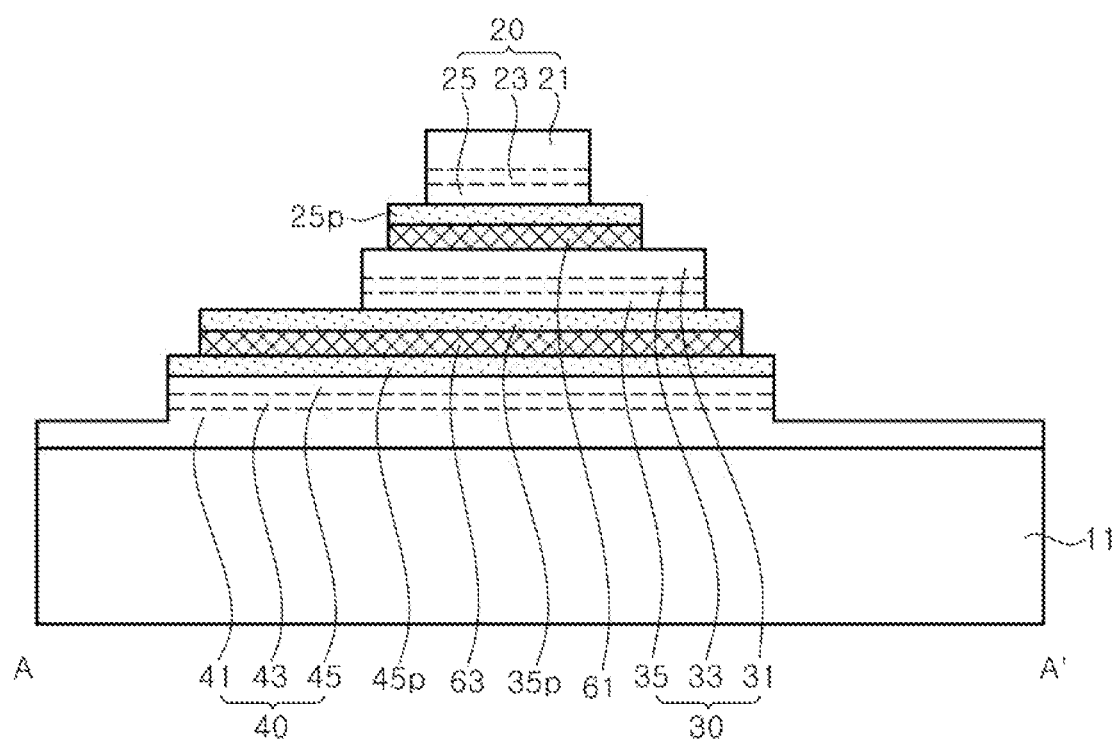
Figure 7C:
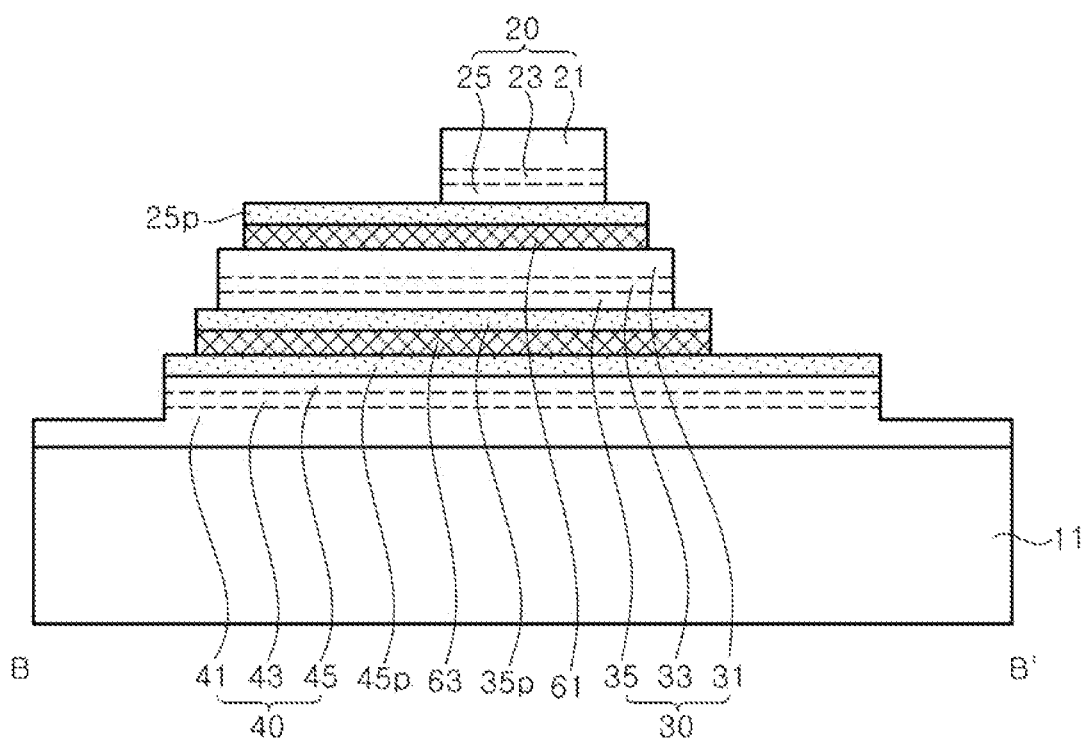

Referring to FIGS. 7A, 7B, and 7C, the third lower contact electrode 45p is patterned so that a portion of the third lower contact electrode 45p surrounds the second lower contact electrode 35p. The third lower contact electrode 45p may be patterned using a fifth mask. Further, the first conductivity type semiconductor layer 41 may be exposed by patterning the second conductivity type semiconductor layer 45 and the active layer 43. For example, the third lower contact electrode 45p may be etched using a wet etching technique, and the second conductivity type semiconductor layer 45 and the active layer 43 may be etched using a dry etching technique. Accordingly, the first conductivity type semiconductor layer 41 is exposed around the third lower contact electrode 45p.

According to the illustrated exemplary embodiment, the first light emitting stack 20 has the smallest area among the light emitting stacks 20, 30, and 40. The third light emitting stack 40 may have the largest area among the light emitting stacks 20, 30, and 40, and thus, luminance intensity of the third light emitting stack 40 may be relatively increased. However, the inventive concepts are not particularly limited to the relative sizes of the light emitting stacks 20, 30, and 40.

Figure 8A:
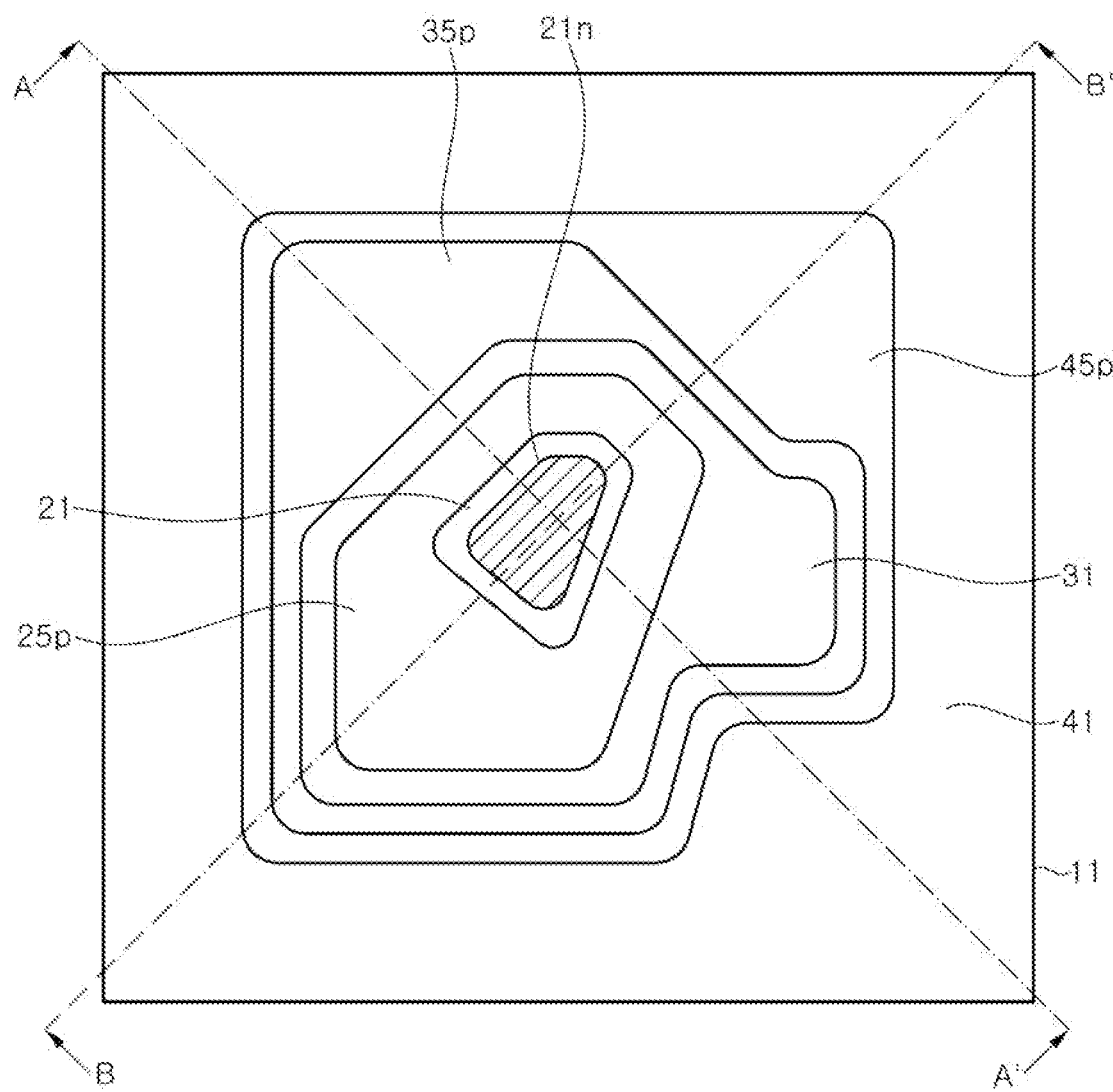
Figure 8B:
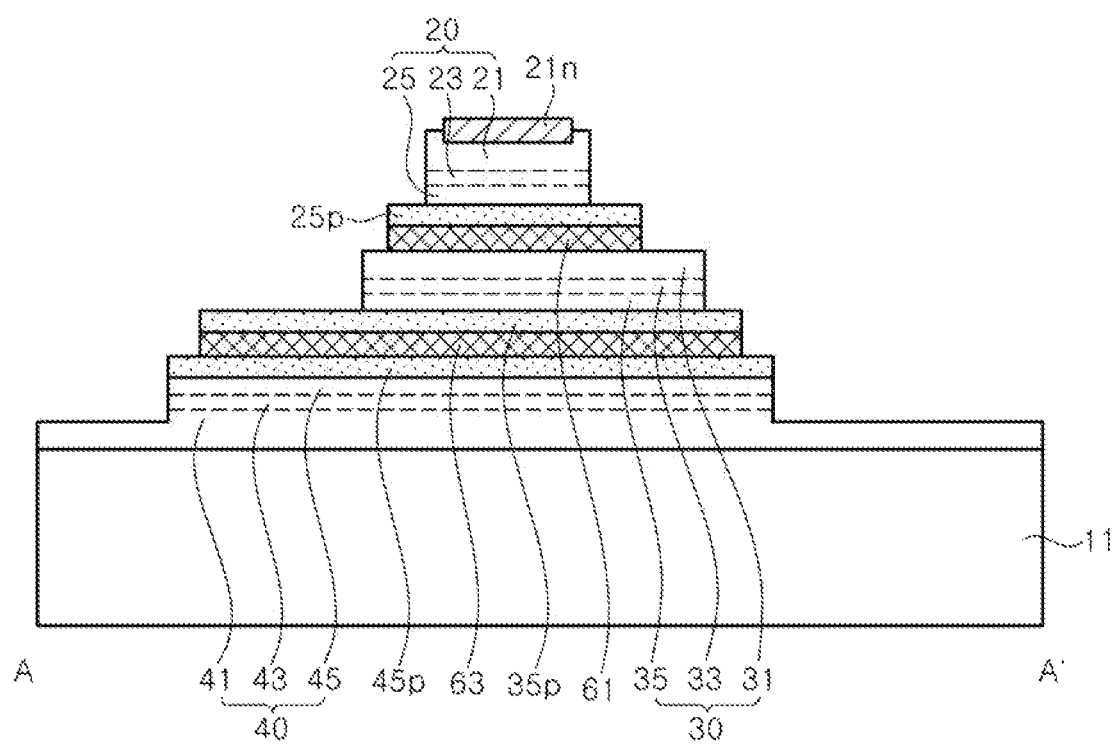
Figure 8C:
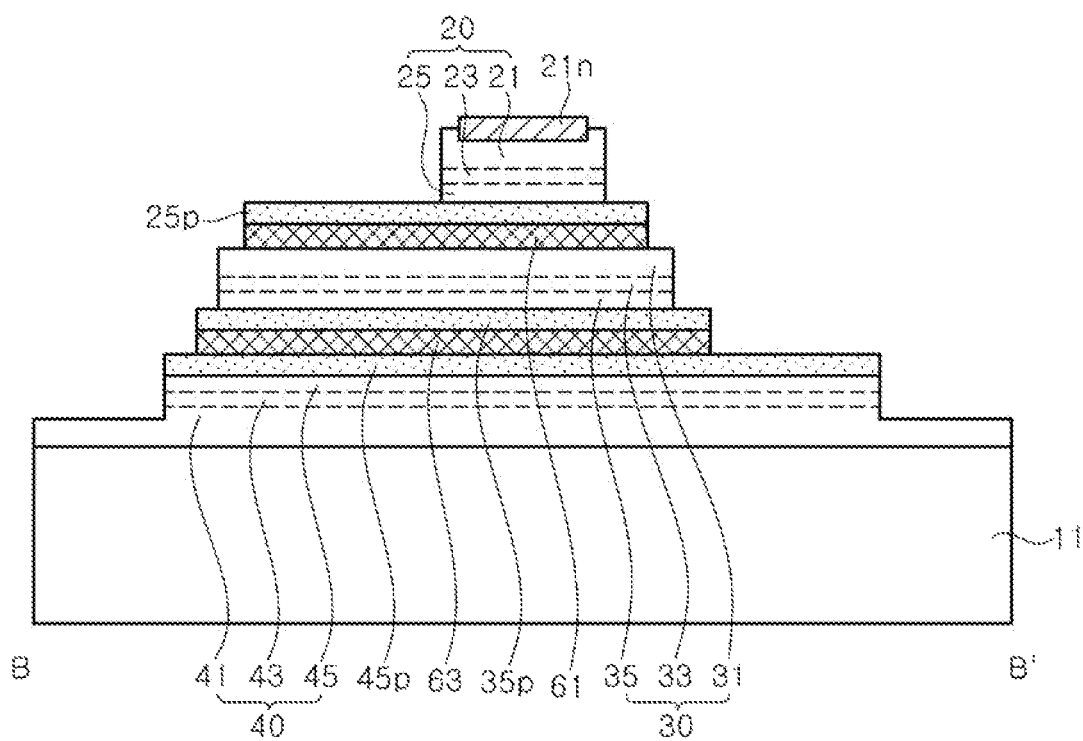

Referring to FIGS. 8A, 8B, and 8C, a portion of an upper surface of the first conductivity type semiconductor layer 21 of the first light emitting stack 20 may be patterned through wet etching to form a first upper contact electrode 21n. The first conductivity type semiconductor layer 21 may be, for example, an n++ GaAs layer, and a portion of an upper surface of the n++ GaAs layer may be recessed through wet etching.

A first upper contact electrode 21n is formed in the recessed region of the first conductivity type semiconductor layer 21. The first upper contact electrode 21n may be formed of, for example, AuGe/Ni/Au/Ti, and may have a thickness of, for example, 100 nm/25 nm/100 nm/10 nm. By partially removing the surface of the n++ GaAs layer, and forming the first upper contact electrode 21n in the recessed region of the first conductivity type semiconductor layer 21, ohmic contact characteristics may be improved.

Figure 9A:
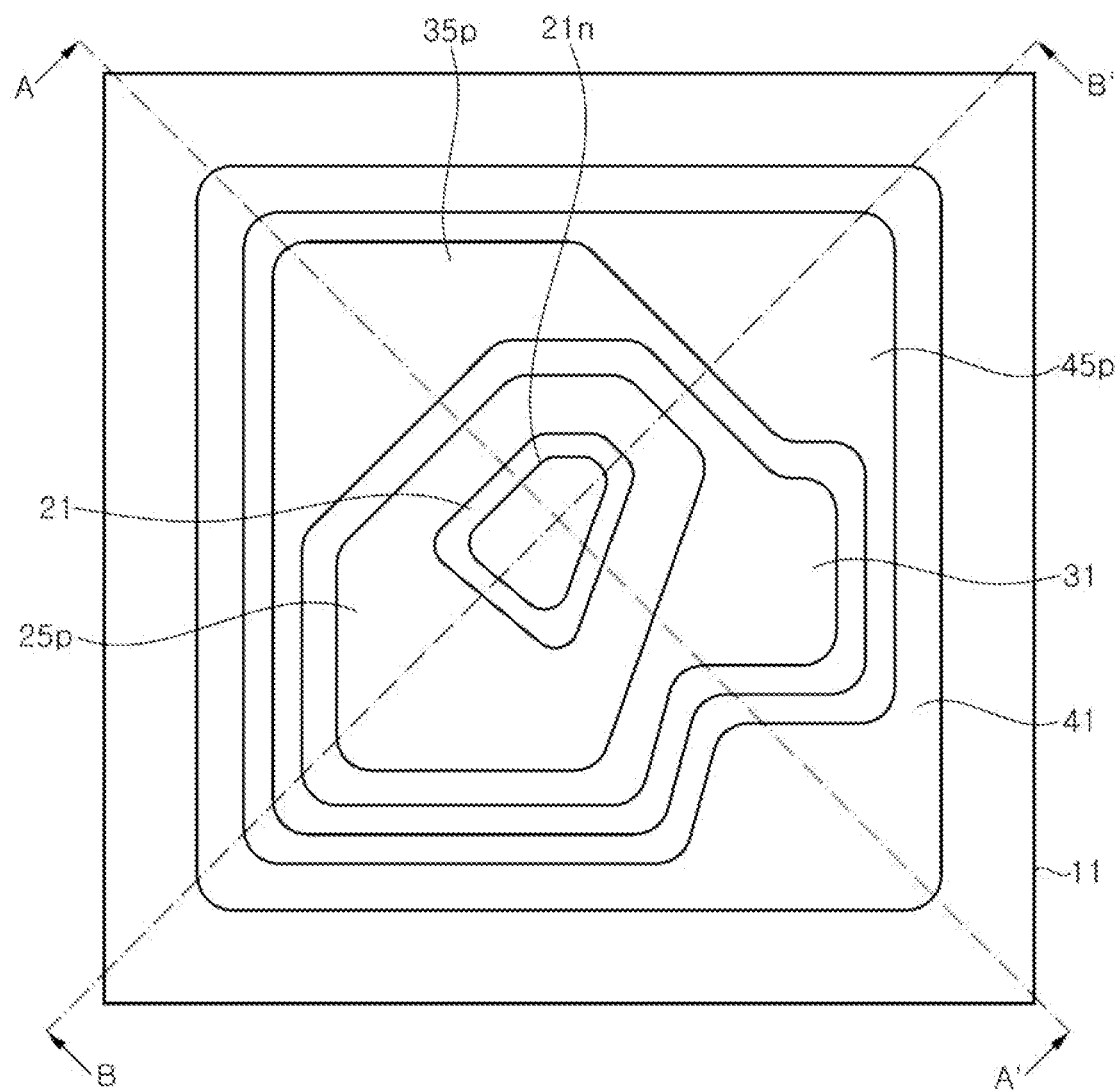
Figure 9B:
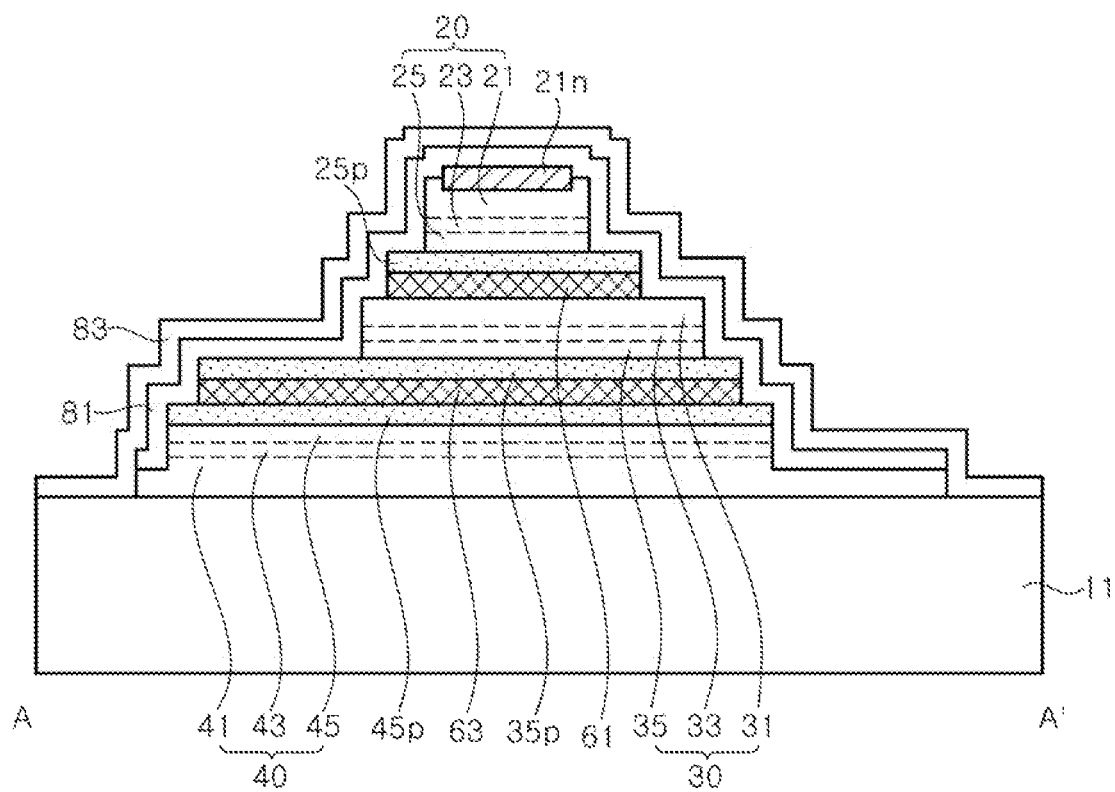
Figure 9C:
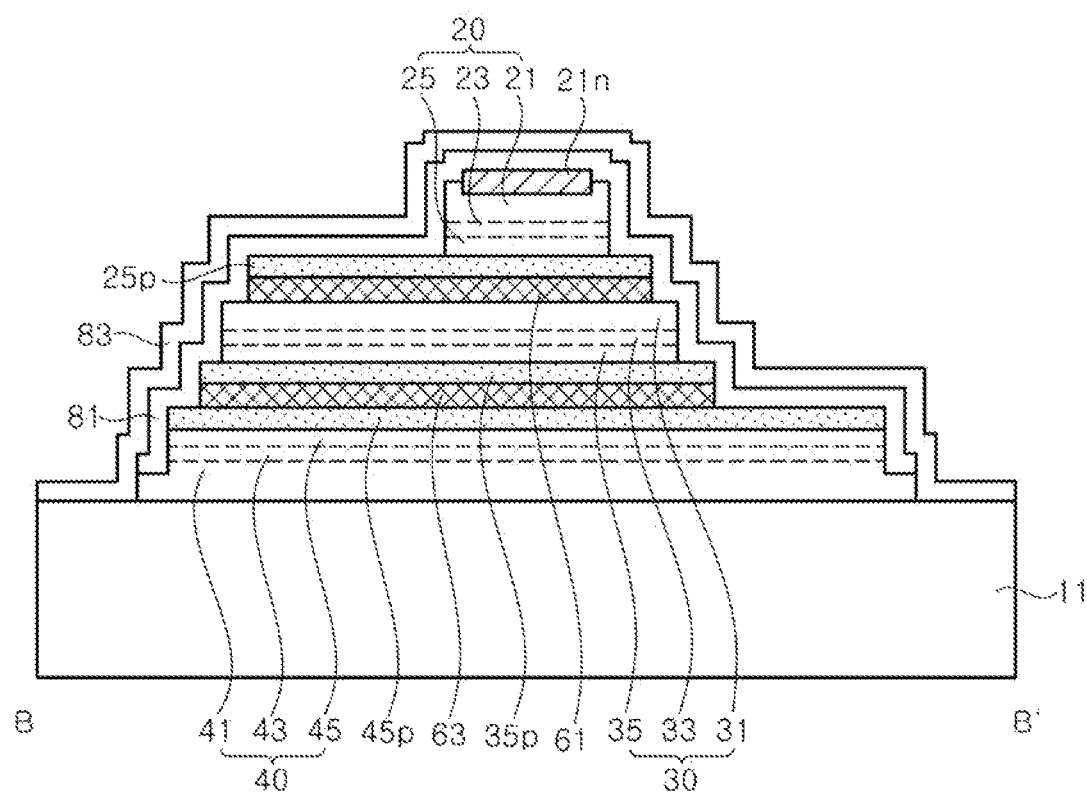

Referring to FIGS. 9A, 9B, and 9C, a first insulation layer 81 covering the light emitting stacks 20, 30, and 40 is formed. The first insulation layer 81 covers the first upper contact electrode 21n. The first insulation layer 81 may be formed of, for example, $SiN_x$, $SiO_2$, $Al_2O_3$, or the like to have a thickness of about 4000 Å.

Subsequently, the first insulation layer 81 and the first conductivity type semiconductor layer 41 may be patterned to form an isolation region for separating the light emitting device regions. Accordingly, an upper surface of the substrate 11 may be exposed around the first conductivity type semiconductor layer 41.

A second insulation layer 83 may be formed on the first insulation layer 81. The second insulation layer 83 may cover a side surface of the first conductivity type semiconductor layer 41 to protect the first conductivity type semiconductor layer 41. The second insulation layer 83 may be formed of $SiN_x$, $SiO_2$, $Al_2O_3$, or the like.

Figure 10A:
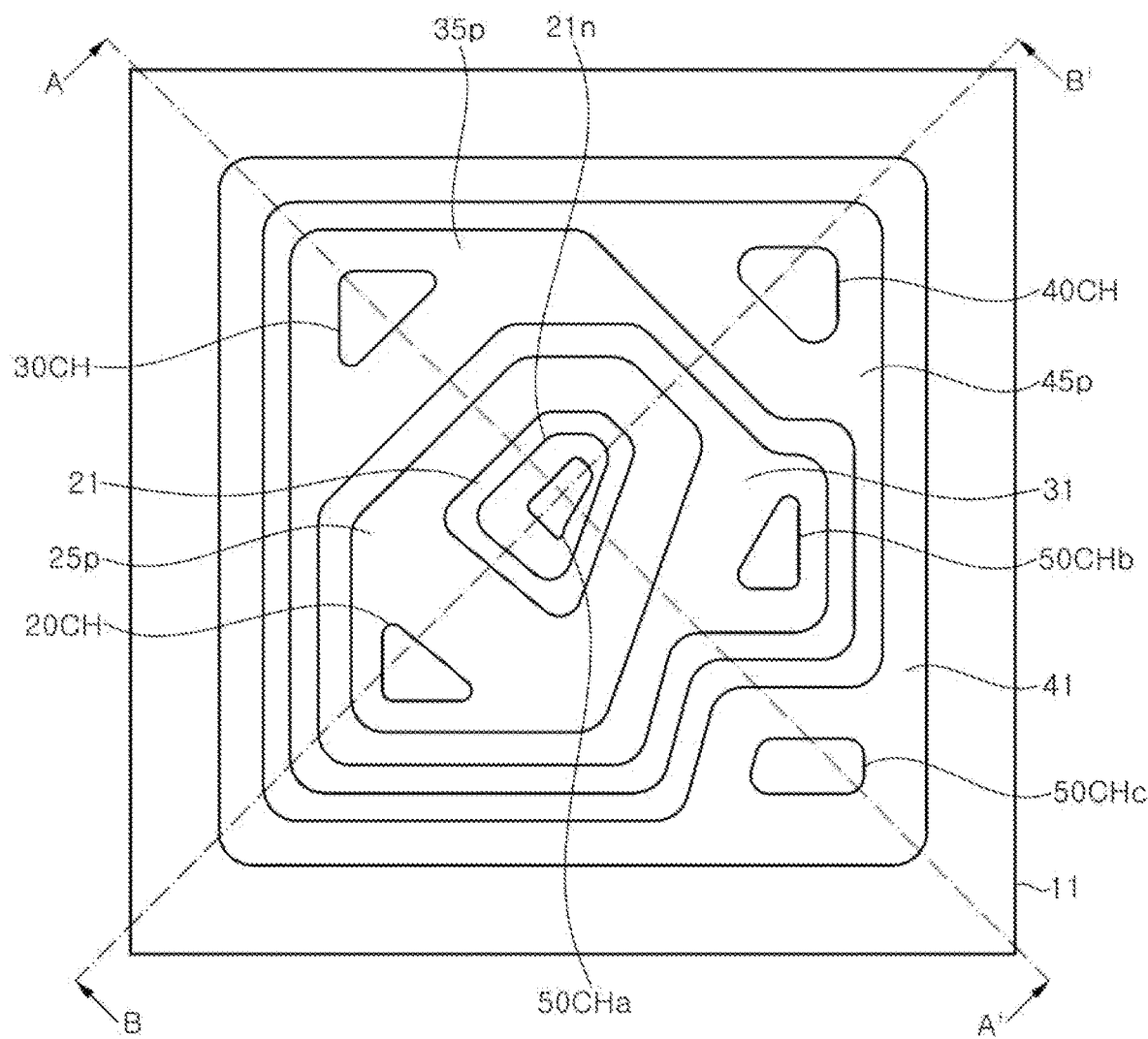
Figure 10B:
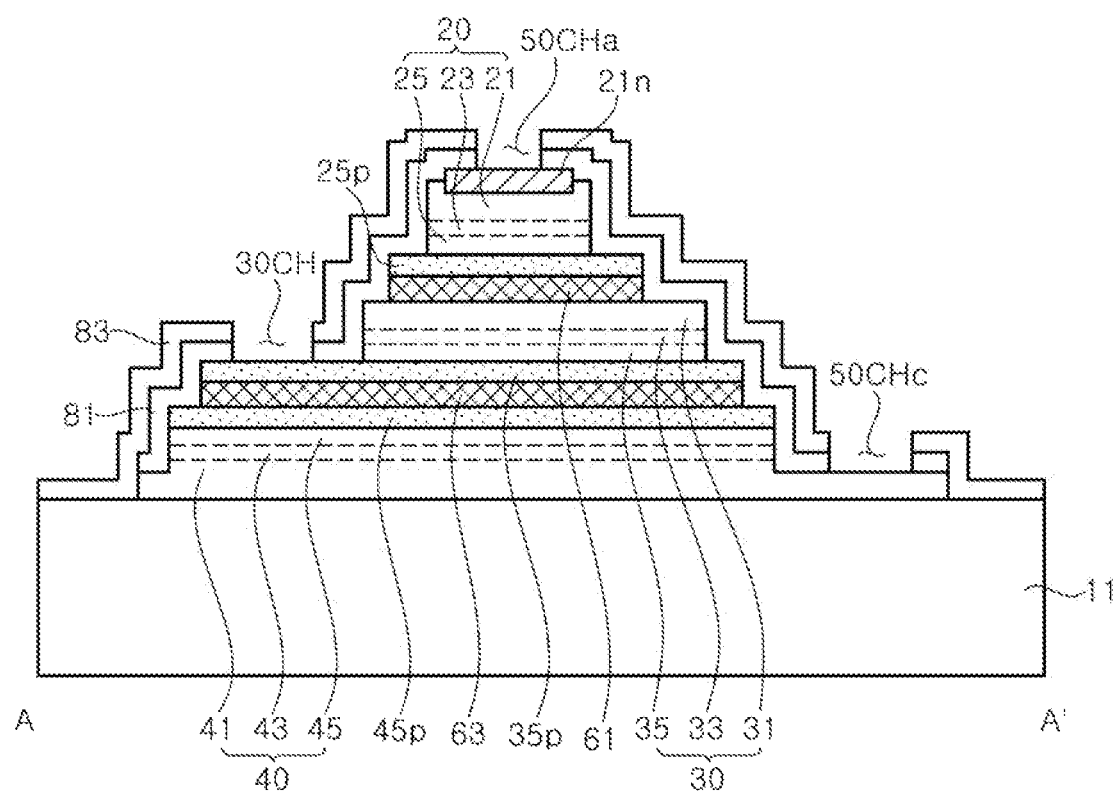
Figure 10C:
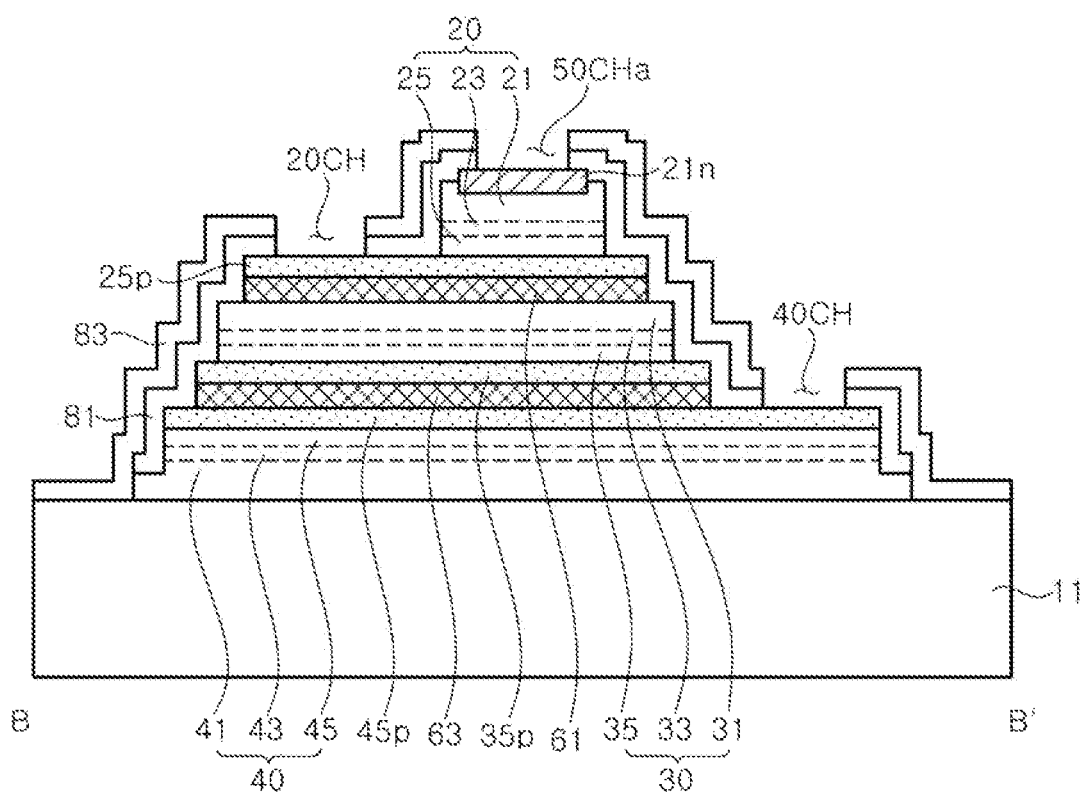

Referring to FIGS. 10A, 10B, and 10C, portions of the first and second insulation layers 81 and 83 may be removed to form first, second, third, and fourth contact holes 20CH, 30CH, 40CH, and 50CH. The first contact hole 20CH is defined on the first lower contact electrode 25p to expose a portion of the first lower contact electrode 25p. The second contact hole 30CH is defined on the second lower contact electrode 35p and may expose the second lower contact electrode 35p. The third contact hole 40CH is defined on the third lower contact electrode 45p and may expose the third lower contact electrode 45p.

The fourth contact hole 50CH provides a path for allowing electrical connection to the first conductive type semiconductor layers 21, 31, and 41 of the first, second, and third light emitting stacks 20, 30, and 40. The fourth contact hole 50CH may include a first sub-contact hole 50CHa, a second sub-contact hole 50CHb, and a third sub-contact hole 50CHc. The first sub-contact hole 50CHa is defined on the first conductivity type semiconductor layer 21 and may expose a portion of the first upper contact electrode 21n, the second sub-contact hole 50CHb is defined on the first conductivity type semiconductor layer 31 and may expose a portion of the first conductivity type semiconductor layer 31, and the third sub-contact hole 50CHc is defined on the first conductivity type semiconductor layer 41 and may expose a portion of the first conductivity type semiconductor layer 41.

Figure 11A:
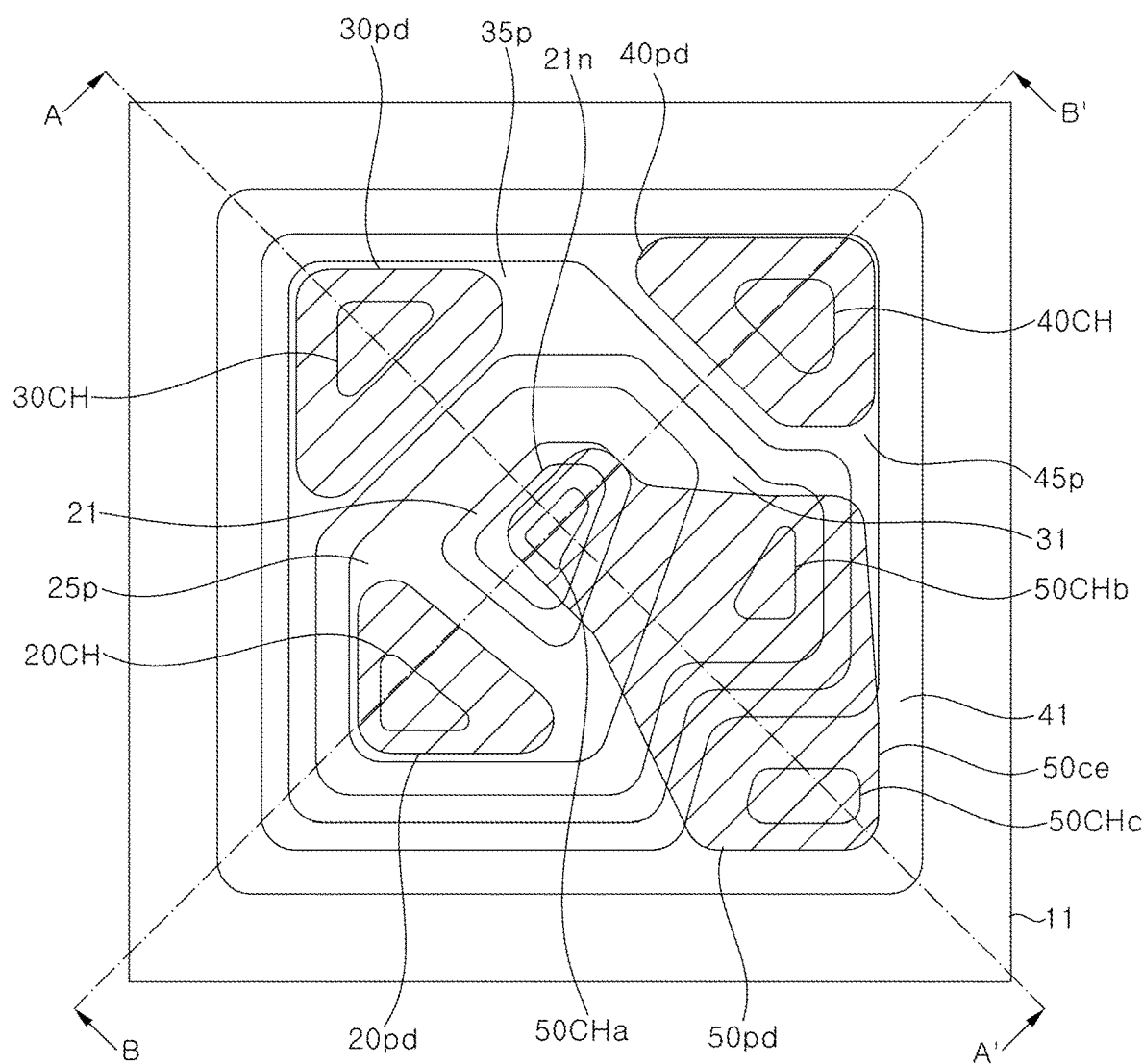
Figure 11B:
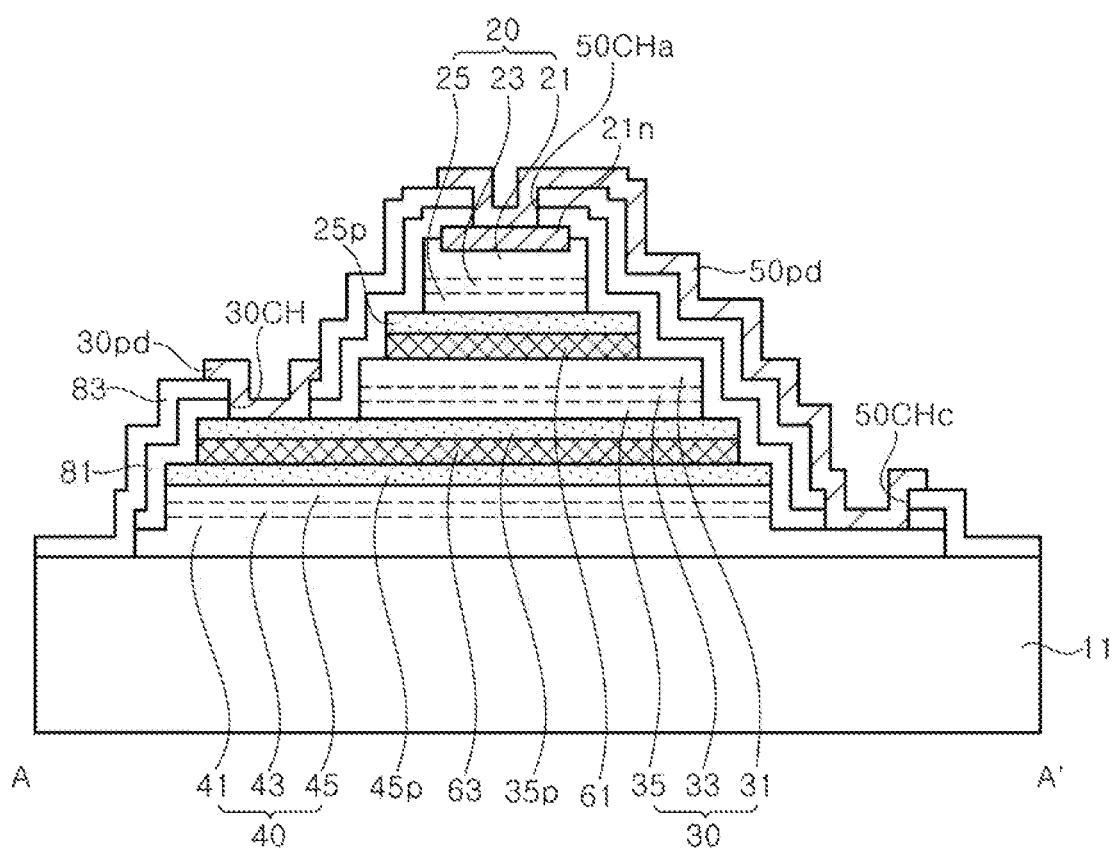
Figure 11C:
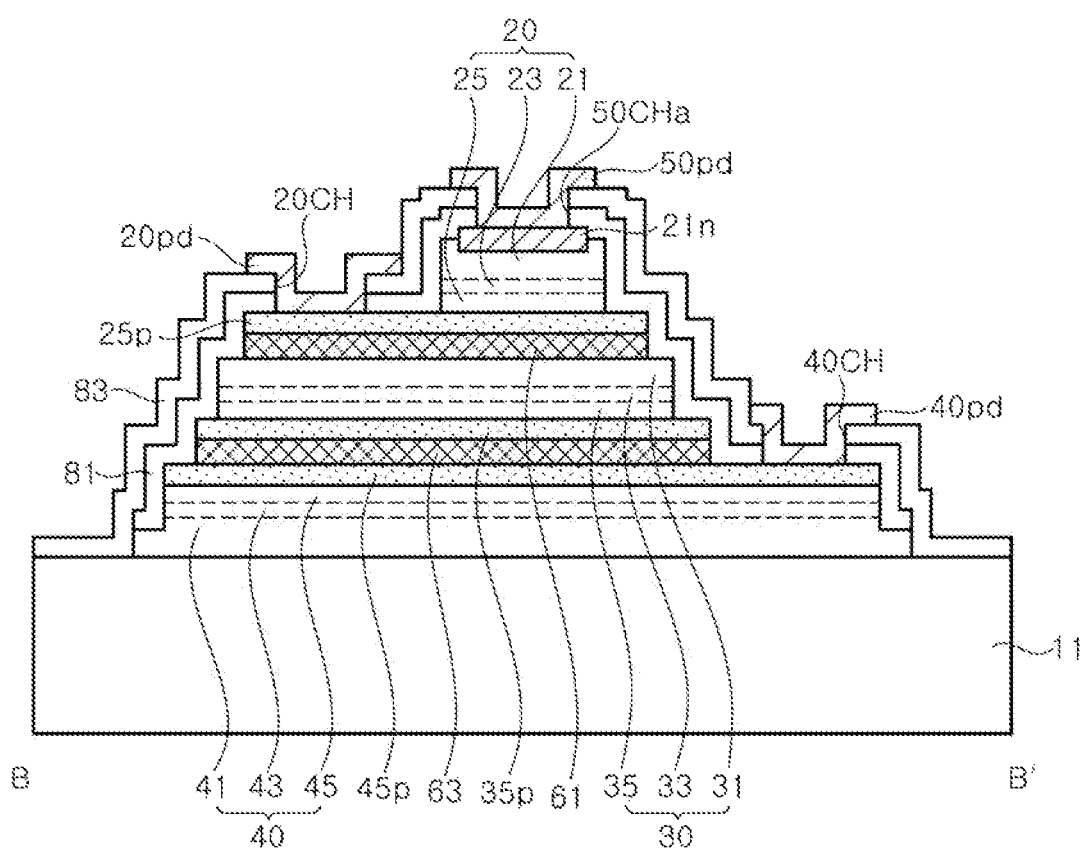

Referring to FIGS. 11A, 11B, and 11C, first, second, third, and fourth pads 20pd, 30pd, 40pd, and 50pd are formed on the first and second insulation layers 81 and 83. The first, second, third, and fourth pads 20pd, 30pd, 40pd, and 50pd may be formed by, for example, forming a conductive layer on a substantially entire surface of the substrate 11, and patterning the conductive layer using photolithography and etching processes.

The first pad 20pd may be formed to overlap with a region where the first contact hole 20CH is formed, and may be connected to the first lower contact electrode 25p through the first contact hole 20CH. The second pad 30pd may be formed to overlap with a region where the second contact hole 30CH is formed, and may be connected to the second lower contact electrode layer 35p through the second contact hole 30CH. The third pad 40pd may be formed to overlap with a region where the third contact hole 40CH is formed, and may be connected to the third lower contact electrode 45p through the third contact hole 40CH. The fourth pad 50pd may be formed to overlap with a region where the fourth contact hole 50CH is formed, particularly regions where the first, second, and third sub-contact holes 50CHa, 50CHb, and 50CHc are formed, and may be electrically connected to the first conductivity type semiconductor layers 21, 31, and 41 of the light emitting stacks 20, 30, and 40.

The first, second, third, and fourth pads 20pd, 30pd, 40pd, and 50pd may include Au, may be formed in a stacked structure of Ti/Ni/Ti/Ni/Ti/Ni/Au/Ti, for example, and thicknesses thereof may be, for example, about 100 nm/50 nm/100 nm/50 nm/100 nm/50 nm/3000 nm/10 nm.

Figure 12A:
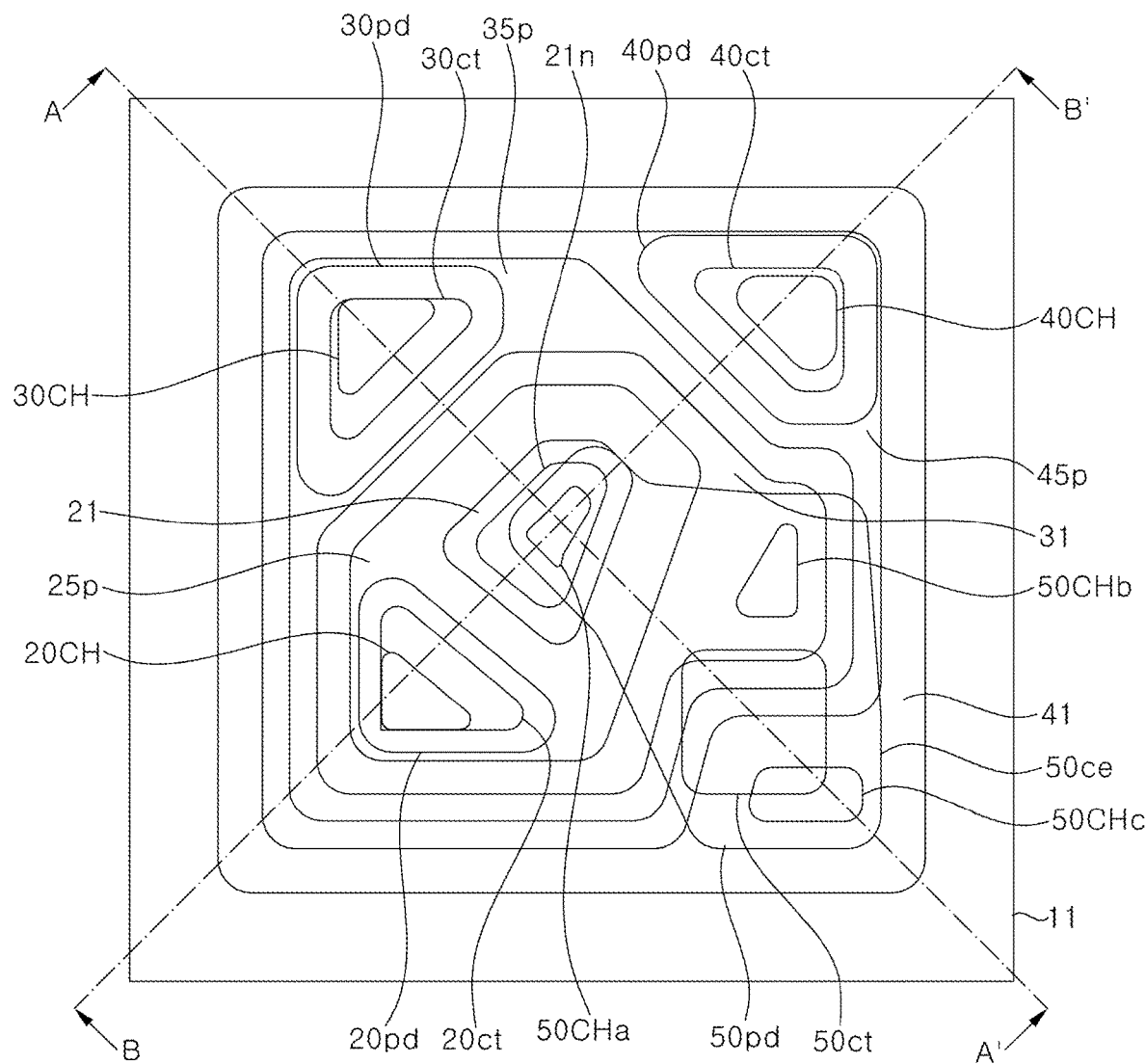
Figure 12B:
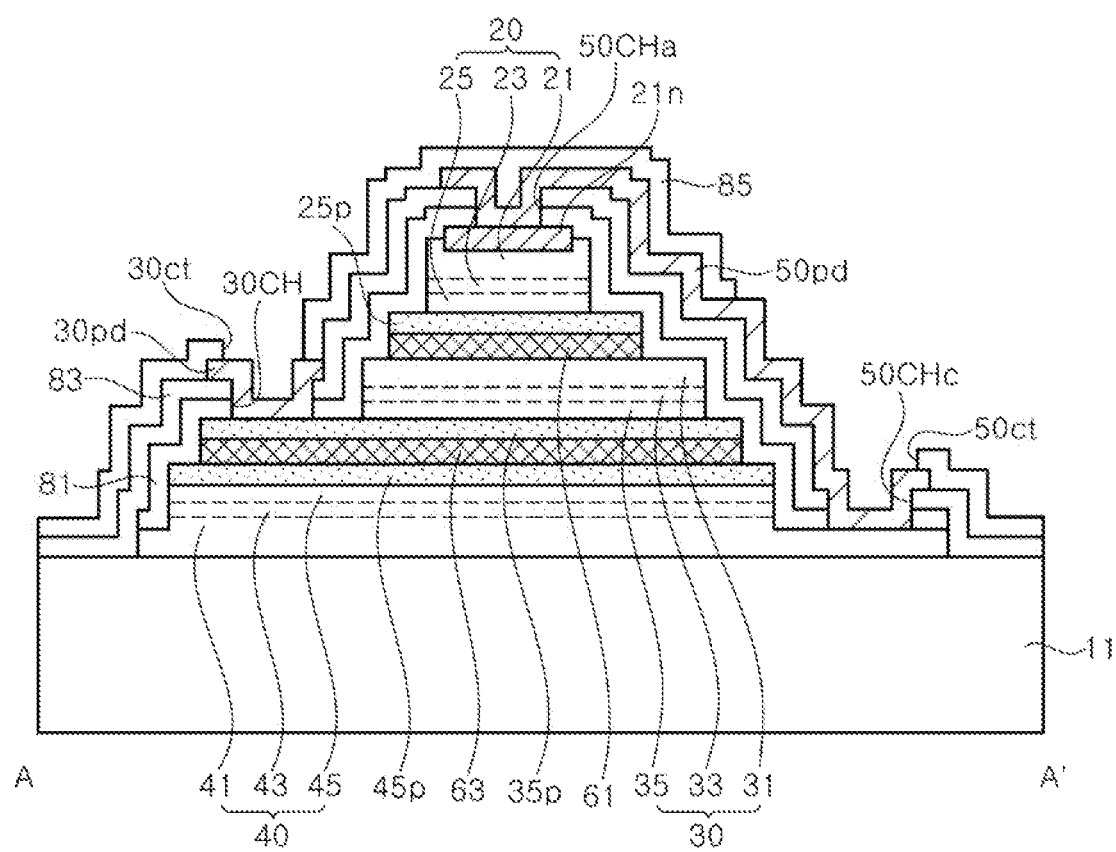
Figure 12C:
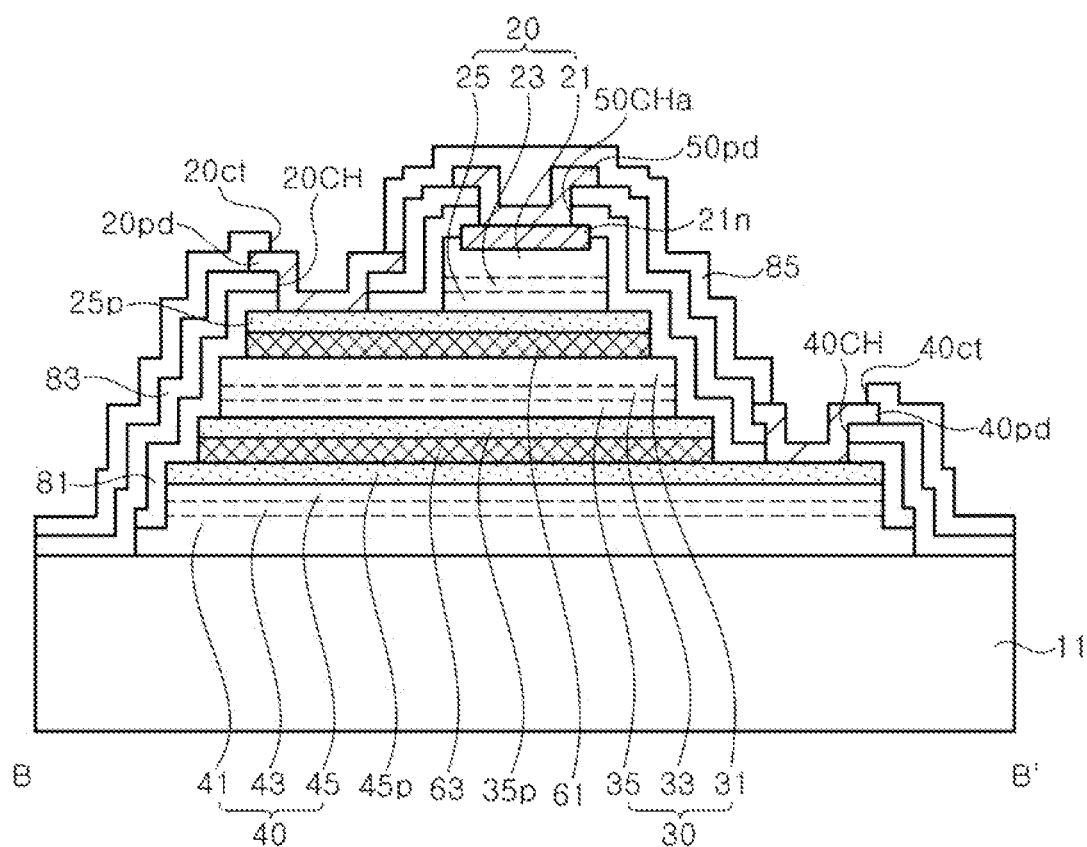

Referring to FIGS. 12A, 12B, and 12C, a third insulation layer 85 may be formed on the second insulation layer 83. The third insulation layer 85 may be formed of $SiN_x$, $SiO_2$, $Al_2O_3$, or the like.

Subsequently, the third insulation layer 85 may be patterned and first, second, third, and fourth through holes 20ct, 30ct, 40ct, and 50ct exposing the first, second, third, and fourth pads 20pd, 30pd, 40pd, and 50pd may be formed.

The first through hole 20ct formed on the first pad 20pd exposes a portion of the first pad 20pd. The second through hole 30ct formed on the second pad 30pd exposes a portion of the second pad 30pd. The third through hole 40ct formed on the third pad 40pd exposes a portion of the third pad 40pd. The fourth through hole 50ct formed on the fourth pad 50pd exposes a portion of the fourth pad 50pd. In the illustrated exemplary embodiment, the first, second, third, and fourth through holes 20ct, 30ct, 40ct, and 50ct may be defined within regions where the first, second, third, and fourth pads 20pd, 30pd, 40pd, and 50pd are formed, respectively.

Figure 13A:
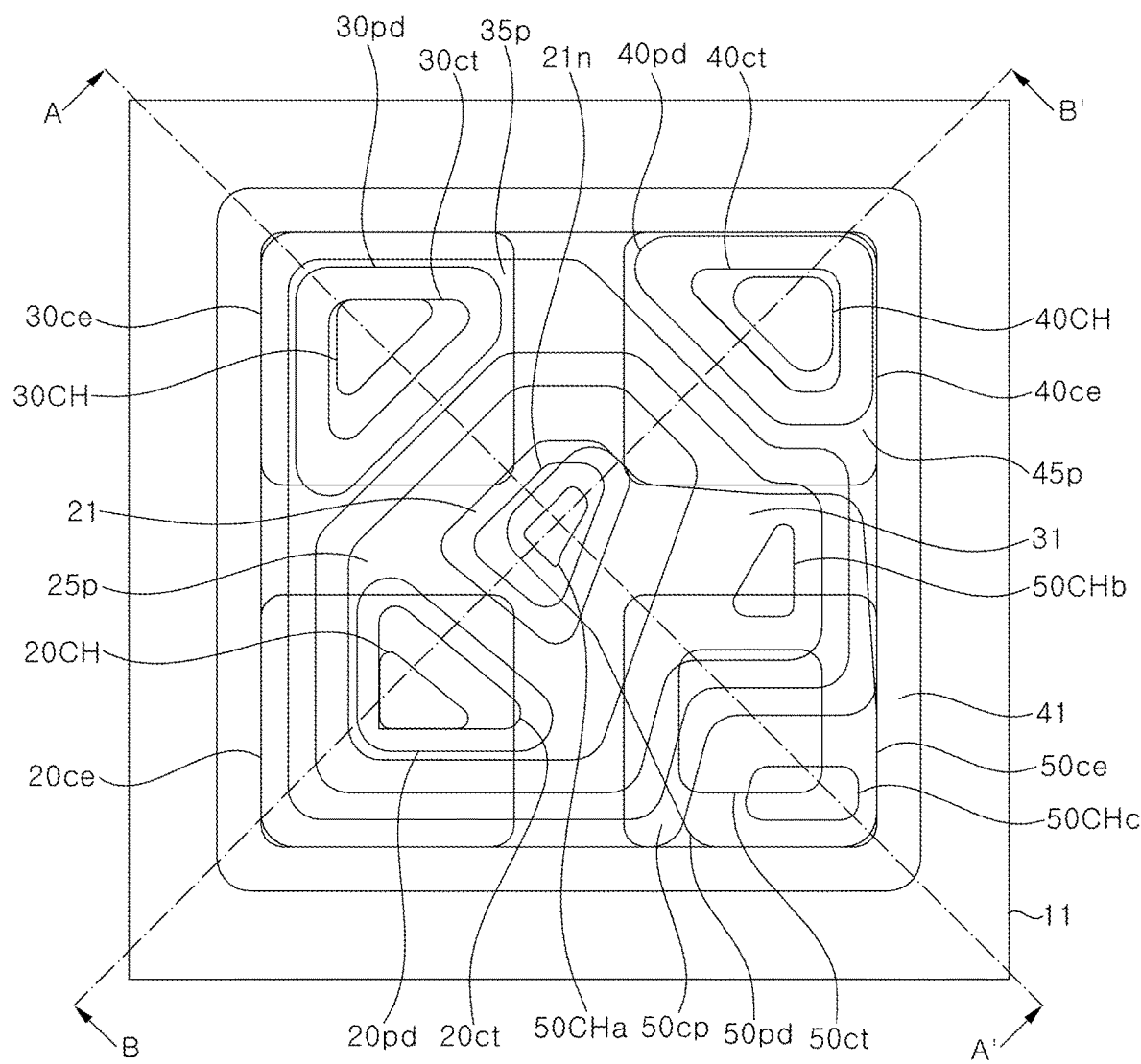
Figure 13B:
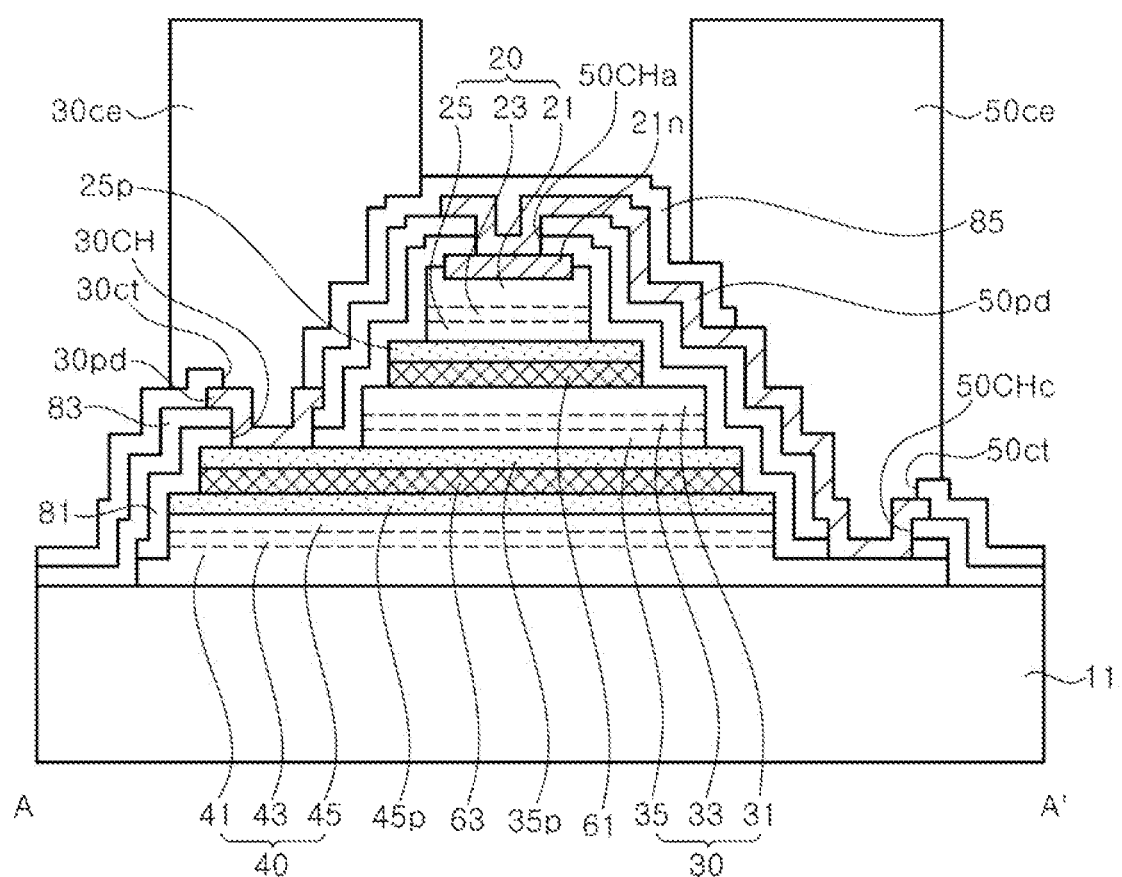
Figure 13C:
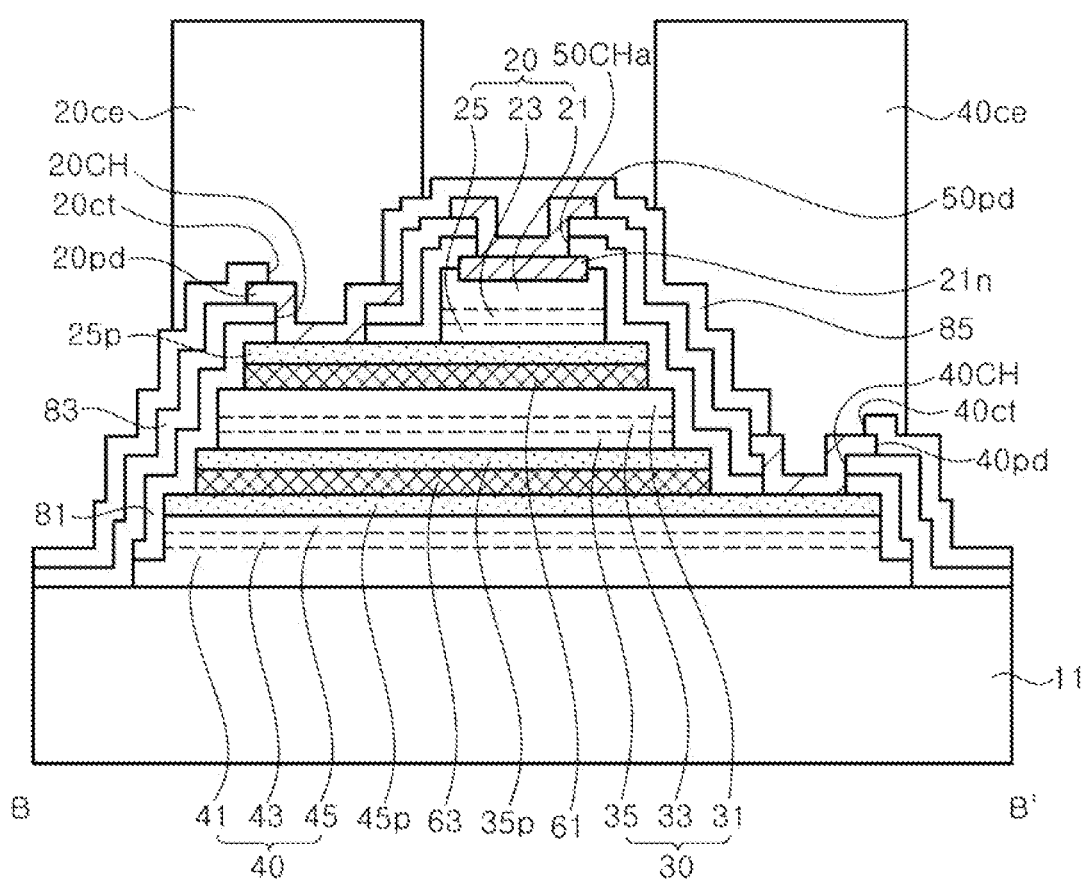

Referring to FIGS. 13A, 13B, and 13C, first, second, third and fourth connection electrodes 20ce, 30ce, 40ce, and 50ce are formed on the third insulation layer 85 on which the first, second, third and fourth through holes 20ct, 30ct, 40ct, and 50ct are formed. The first connection electrode 20ce may be formed to overlap with a region where the first through hole 20ct is formed, and may be connected to the first pad 20pd through the first through hole 20ct. The second connection electrode 30ce may be formed to overlap with a region where the second through hole 30ct is formed, and may be connected to the second pad 30pd through the second through hole 30ct. The third connection electrode 40ce may be formed to overlap with a region where the third through hole 40ct is formed, and may be connected to the third pad 40pd through the third through hole 40ct. The fourth connection electrode 50ce may be formed to overlap with a region where the fourth through hole 50ct is formed, and may be connected to the fourth pad 50pd through the fourth through hole 50ct.

The first, second, third, and fourth connection electrodes 20ce, 30ce, 40ce, and 50ce a may be spaced apart from one another and formed on the light emitting stack structure. The first, second, third, and fourth connection electrodes 20ce, 30ce, 40ce, and 50ce may be electrically connected to the first, second, third, and fourth pads 20pd, 30pd, 40pd, and 50pd, respectively, and transmit an external signal to each of the light emitting stacks 20, 30, and 40.

A method of forming the first, second, third, and fourth connection electrodes 20ce, 30ce, 40ce, and 50ce is not particularly limited. For example, according to an exemplary embodiment, a seed layer is deposited as a conductive surface on the light emitting stack structure, and a photoresist pattern may be formed so that the seed layer is exposed at a location where connection electrodes will be formed. According to an exemplary embodiment, the seed layer may be deposited to have a thickness of about 1000 Å, but the inventive concepts are not limited thereto. The seed layer may be formed of, for example, Ti/Cu. Subsequently, the seed layer may be plated with metal, such as Cu, Ni, Ti, Sb, Zn, Mo, Co, Sn, Ag or an alloy thereof. In particular, Cu may facilitate plating at low cost.

After plating is completed, a polishing process may be carried out to planarize an upper surface of the connection electrode. The photoresist pattern and the seed layer retained between the connection electrodes may then be removed.

According to the illustrated exemplary embodiment, each of the connection electrodes 20ce, 30ce, 40ce, and 50ce may have a substantially elongated shape to be spaced apart from the substrate 11. In another exemplary embodiment, the connection electrodes 20ce, 30ce, and 40ce may include two or more metals or a plurality of different metal layers to reduce stress from the elongated shape of the connection electrodes 20ce, 30ce, 40ce, and 50ce. However, the inventive concepts are not limited to a specific shape of the connection electrodes 20ce, 30ce, 40ce, and 50ce, and in some exemplary embodiments, the connection electrode may have various shapes.

The connection electrodes 20ce, 30ce, 40ce, and 50ce may be overlapped with at least one step formed on a side surface of the light emitting stack structure. In this manner, a lower surface of the connection electrode may have a larger contact area than the upper surface thereof, and thus, the light emitting device 100 has a more stable structure capable of withstanding subsequent processes.

Figure 14A:
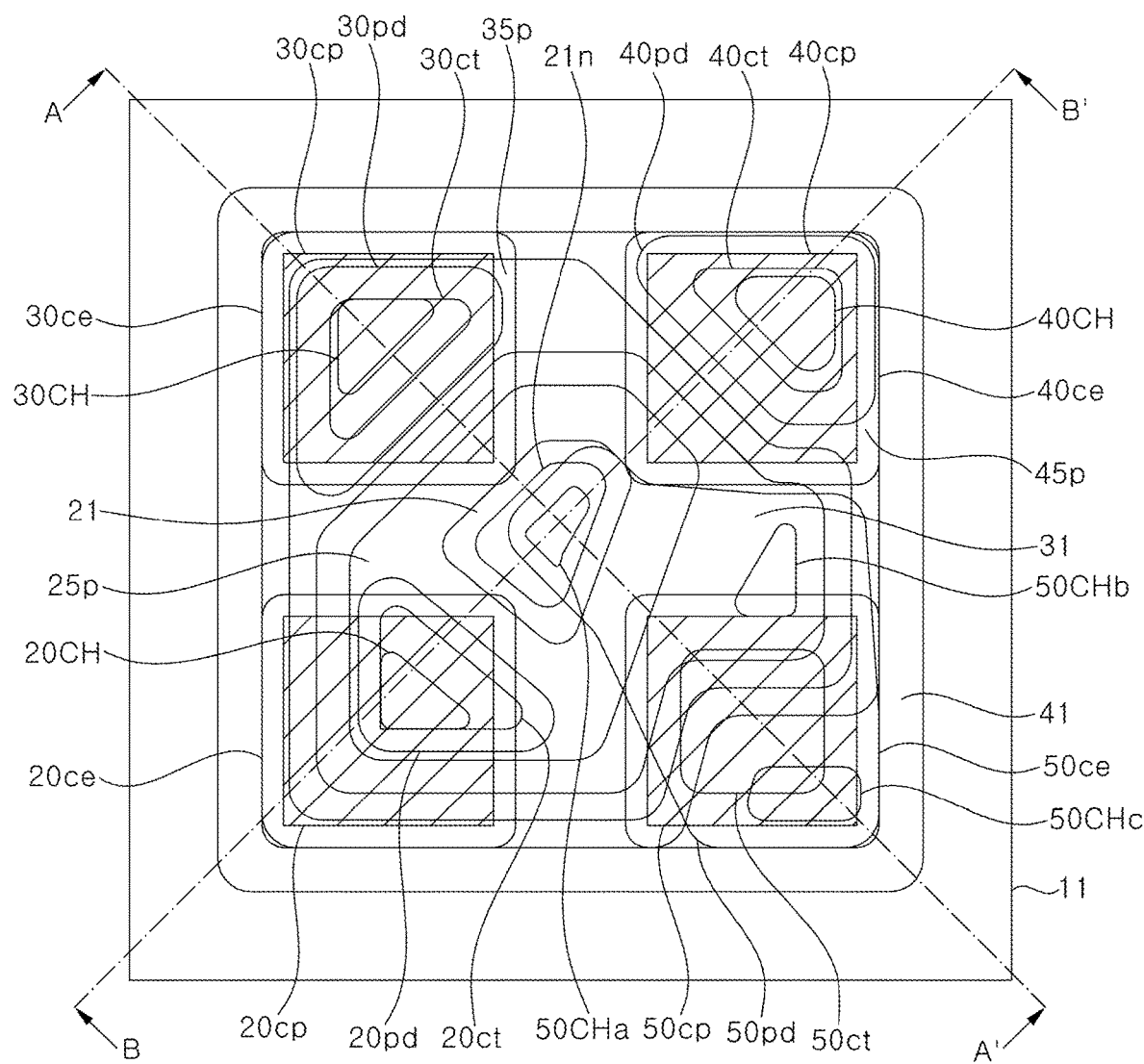
Figure 14B:
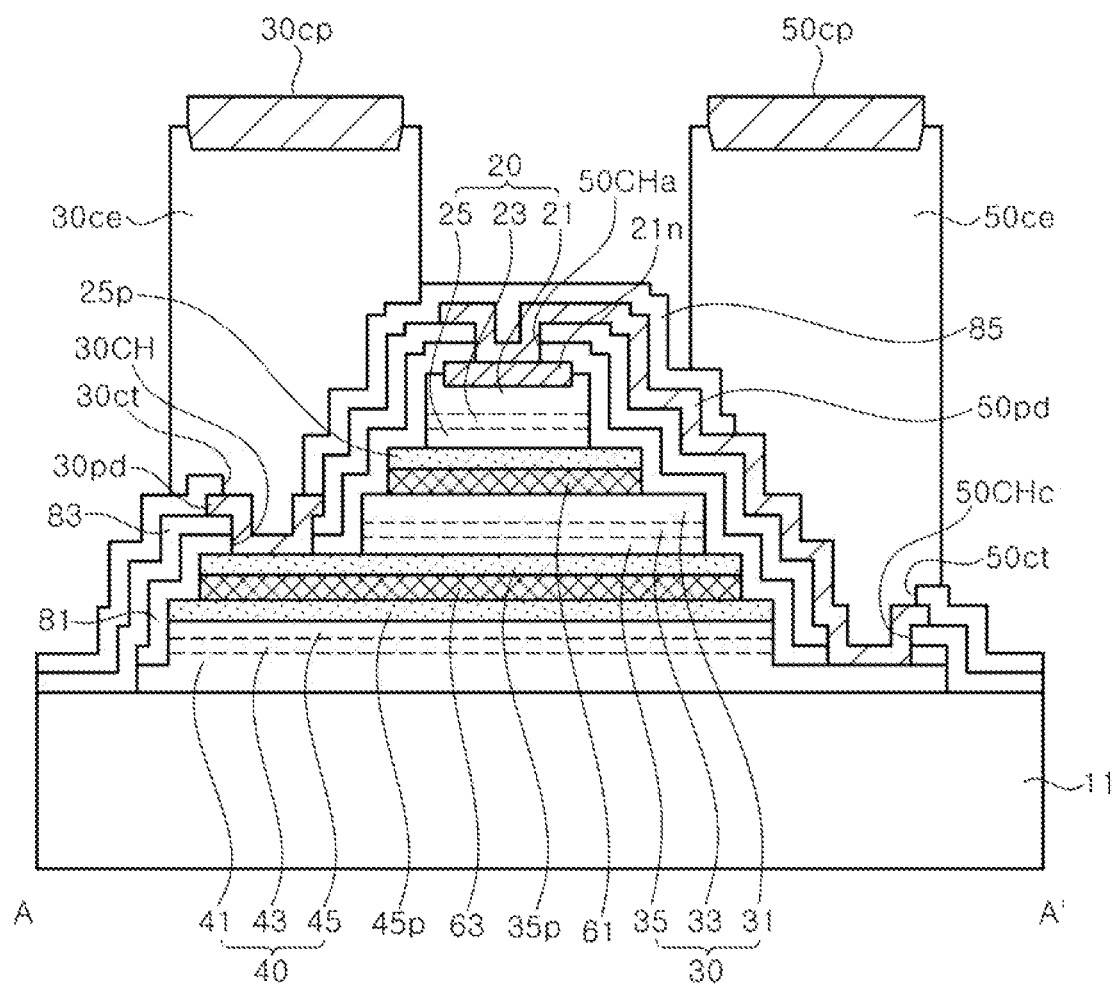
Figure 14C:
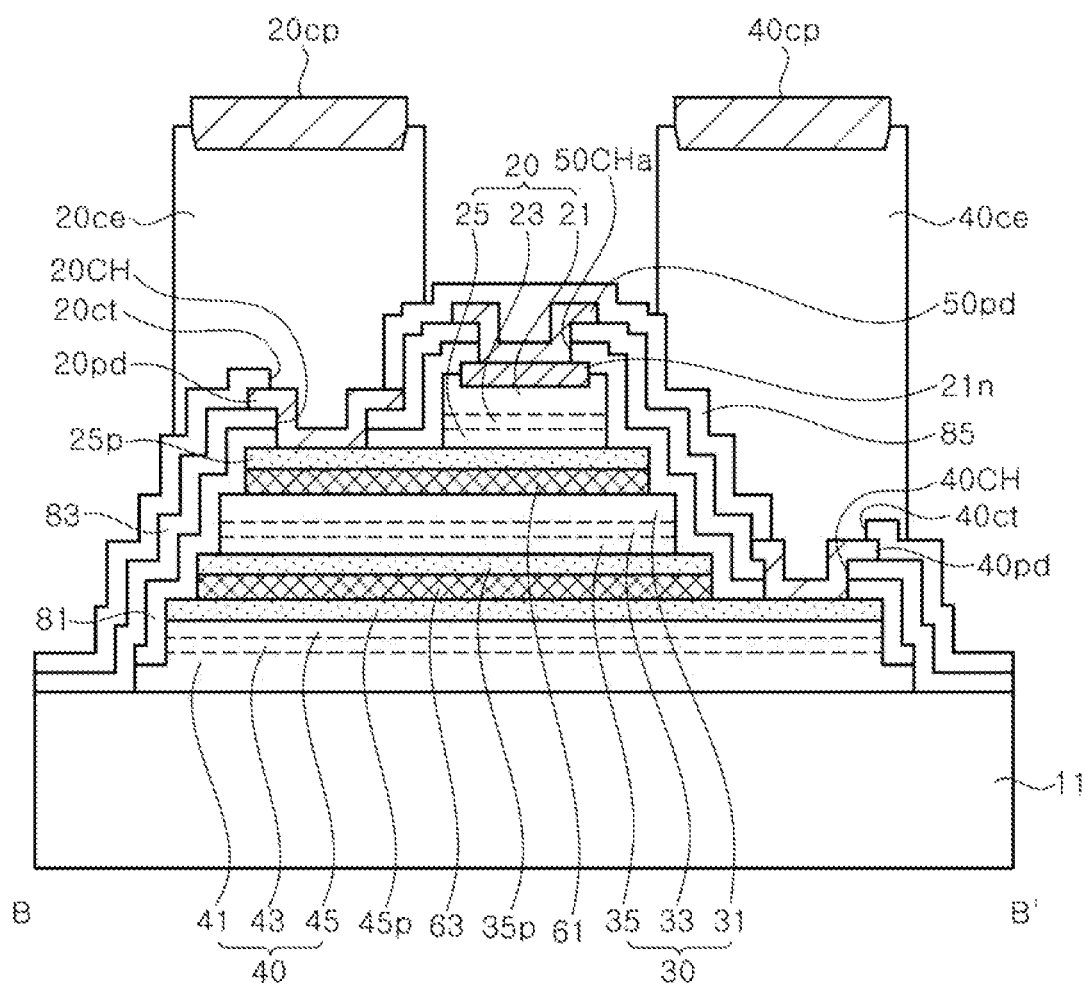

Referring to FIGS. 14A, 14B, and 14C, bonding metal layers 20cp, 30cp, 40cp, and 50cp are formed on the connection electrodes 20ce, 30ce, 40ce, and 50ce. The upper surfaces of the connection electrodes 20ce, 30ce, 40ce, and 50ce may be partially etched to form a recessed region, and the bonding metal layers 20cp, 30cp, 40cp, and 50cp may be formed in the recessed region.

When the connection electrodes 20ce, 30ce, 40ce, and 50ce are formed of metals, while the plating process may be facilitated, however, they may not be suitable for bonding. Further, a natural oxide layer may be formed on the upper surfaces of the connection electrodes 20ce, 30ce, 40ce, and 50ce, which may cause contact failure. As such, by partially removing the upper surfaces of the connection electrodes 20ce, 30ce, 40ce, 50ce and forming the bonding metal layers 20cp, 30cp, 40cp, and 50cp, the natural oxide film may be removed to facilitate the mounting of the light emitting device 100 on the circuit board using eutectic bonding technology. A process of forming the bonding metal layers 20cp, 30cp, 40cp, and 50cp will be described in more detail with reference to FIGS. 15A to 15D.

The light emitting device 100 may be provided by separating the substrate 11 for each light emitting device region. The substrate 11 may be separated using a laser scribing technique. In other exemplary embodiments, the substrate 11 may be removed from the third light emitting stack 40.

FIGS. 15A, 15B, 15C, and 15D are schematic cross-sectional views illustrating a method of forming a bonding metal layer according to an exemplary embodiment. Hereinafter, a method of forming a bonding metal layer 30cp on a connection electrode 30ce will exemplarily be described.

Figure 15A:
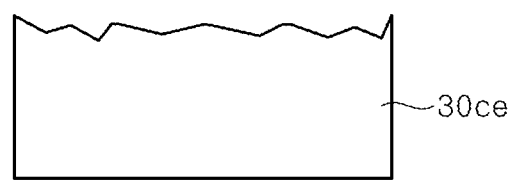
FIGS. 15A, 15B, 15C, and 15D are schematic cross-sectional views illustrating a method of forming a bonding metal layer according to an exemplary embodiment.

Referring to FIG. 15A, the connection electrode 30ce is formed through plating using a photoresist pattern. The connection electrode 30ce formed by plating may have a rough surface as illustrated. While the connection electrode 30ce is formed through plating, other connection electrodes 20ce, 40ce, and 50ce may be formed together.

Figure 15B:

Referring to FIG. 15B, an upper surface of the connection electrode 30ce may be polished to planarize the upper surface thereof. While the surface of the connection electrode 30ce is polished, surfaces of the connection electrodes 20ce, 40ce, and 50ce may also be polished together.

Figure 15C:
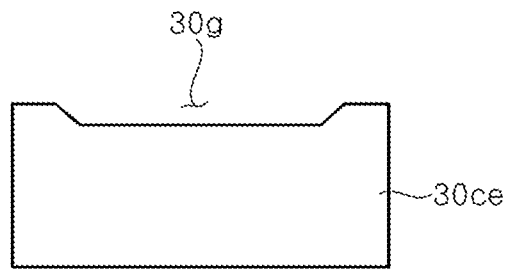

Referring to FIG. 15C, a groove 30g is formed by etching the surface of the connection electrode 30ce. As described above, a natural oxide film and contaminants that may be formed on the surface of the connection electrode 30ce may be removed by an etching process. For example, a photoresist pattern covering an edge of the connection electrode 30ce is formed, and an upper surface of the connection electrode 30ce is etched. When the connection electrode 30ce is formed of Cu, the connection electrode 30ce may be wet etched using a mixed solution of sulfuric acid, phosphoric acid and hydrogen peroxide, a mixed solution of hydrochloric acid, ammonium persulfate, potassium chloride, phosphoric acid, and hydrogen peroxide, or the like. As such, the natural oxide film on the surface of the connection electrode 30ce may be removed, and surface roughness may be improved. The groove 30g may be formed to have a depth of, for example, 100 nm.

Figure 15D:
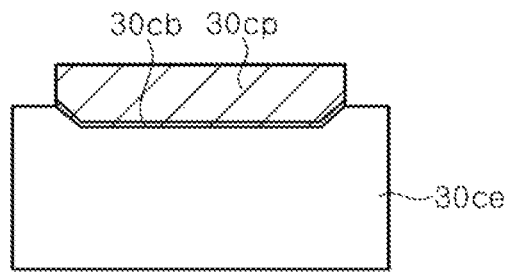

Referring to FIG. 15D, a barrier layer 30cb and a bonding metal layer 30cp may be formed using the photoresist pattern, and thereafter, the photoresist pattern may be removed. More particularly, the barrier layer 30cb and the bonding metal layer 30cp may be formed using a lift-off technique.

The barrier layer 30cb may include, for example, a single layer or multiple layers such as Ti, Ni, W, Cr, and Co. For example, the barrier layer 30cb may be formed of Ni, Ti, or Ti/Ni.

The bonding metal layer 30cp may be formed of Au or Au/In. In particular, Au is suitable for probing, as well as for eutectic bonding with In or Sn.

The method of forming the bonding metal layer 30cp on the connection electrode 30ce is exemplarily described above, but the bonding metal layers 20cp, 40cp, 50cp may be formed on the other connection electrodes 20ce, 40ce, and 50*ce* by the same method, and the bonding metal layers 20*cp*, 30*cp*, 40*cp*, and 50*cp* may be formed together in the same process.

Figure 16A:
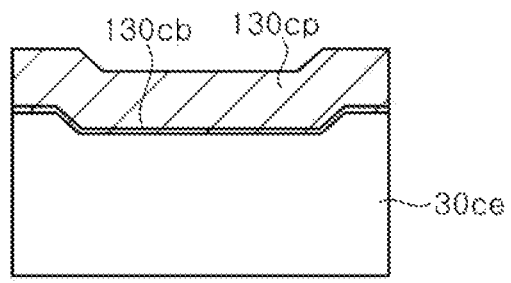
FIGS. 16A and 16B are cross-sectional views of a bonding metal layer according to exemplary embodiments.
Figure 16B:
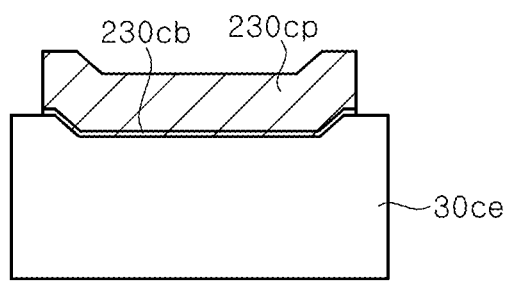

FIGS. 16A and 16B are cross-sectional views of a bonding metal layer according to exemplary embodiments.

Referring to FIG. 16A, in an exemplary embodiment, a bonding metal layer 130*cp* may cover an entire upper surface of the connection electrode 30*ce*. A barrier layer 130*cb* may cover the entire upper surface of the connection electrode 30*ce*, and the bonding metal layer 130*cp* may be disposed on the barrier layer 130*cb*. More particularly, the barrier layer 130*cb* may cover the upper surface of the connection electrode 30*ce* at the outside of a groove 30*g* as well as the inside of the groove 30*g*.

For example, after a portion of the upper surface of the connection electrode 30*ce* is exposed using a first photoresist pattern, the groove 30*g* is formed using a wet etching technique. Subsequently, the first photoresist pattern is removed, and the entire upper surface of the connection electrode 30*ce* is exposed using a second photoresist pattern. Thereafter, the barrier layer 130*cb* and the bonding metal layer 130*cp* may be formed using the second photoresist pattern.

Referring to FIG. 16B, in an exemplary embodiment, a barrier layer 230*cb* and a bonding metal layer 230*cp* may cover the groove 30*g* of the connection electrode 30*ce*, and further, may partially cover the upper surface of the connection electrode 30*ce* around the groove 30*g*. As such, an edge of the upper surface of the connection electrode 30*ce* may be exposed to the outside.

For example, after the portion of the upper surface of the connection electrode 30*ce* is exposed using the first photoresist pattern, the groove 30*g* is formed using a wet etching technique. Subsequently, the first photoresist pattern is removed, and the portion of upper surface of the connection electrode 30*ce* including the groove 30*g* is exposed using the second photoresist pattern. Thereafter, the barrier layer 230*cb* and the bonding metal layer 230*cp* may be formed using the second photoresist pattern.

Although the bonding metal layer 30*cp* have been described according to some exemplary embodiments, the inventive concepts are not limited thereto, and the bonding metal layer 30*cp* may be formed using various other methods.

Figure 17A:
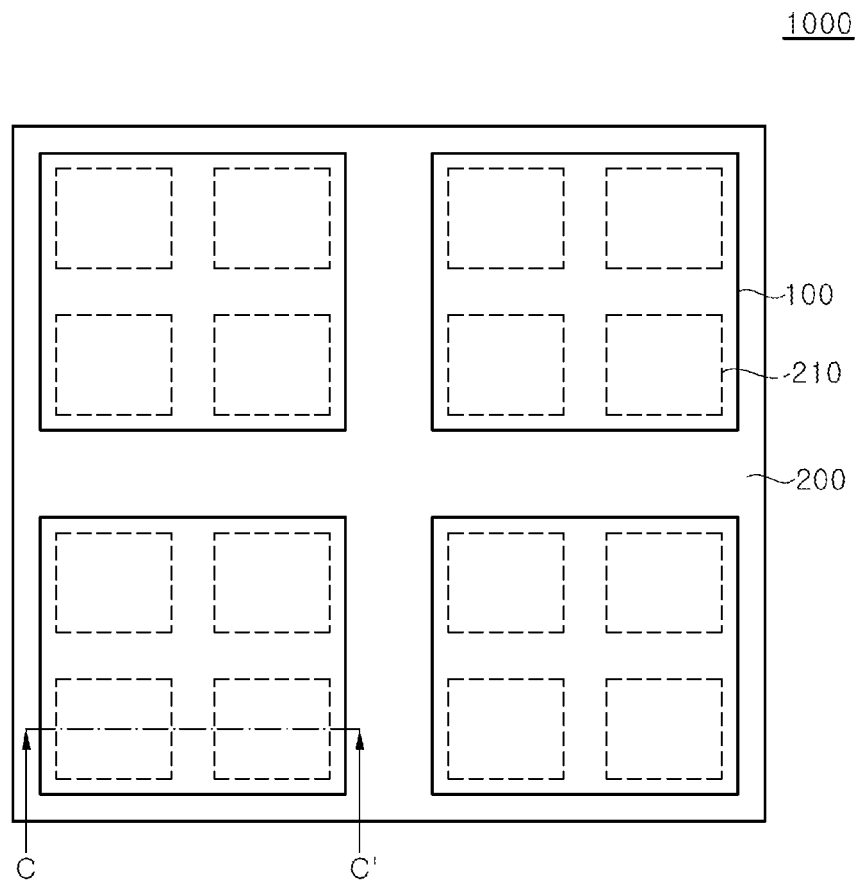
FIG. 17A is a schematic plan view of a display apparatus according to an exemplary embodiment.
Figure 17B:
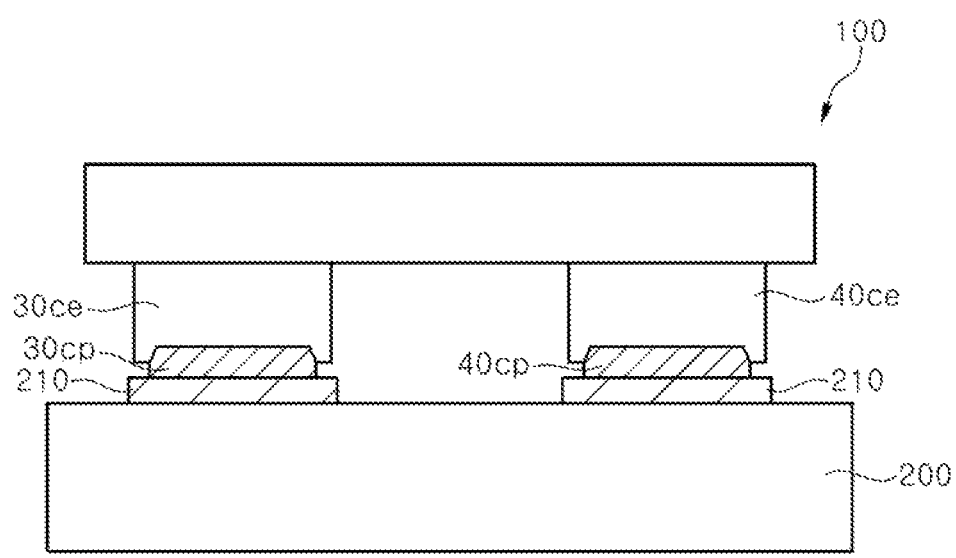
FIG. 17B is a schematic cross-sectional view taken along line C-C' of FIG. 17A.

FIG. 17A is a schematic plan view of a display apparatus 1000 according to an exemplary embodiment, and FIG. 17B is a schematic cross-sectional view taken along line C-C' of FIG. 17A.

Referring to FIGS. 17A and 17B, the display apparatus 1000 may include a display substrate 200 and light emitting devices 100. The light emitting devices 100 may be mounted on the display substrate 200 of a final apparatus, such as a display apparatus. The light emitting devices 100 may be individually mounted or mounted in a group on the display substrate 200. Further, the light emitting devices 100 may be packaged as a group so that a plurality of packages may be mounted on the display substrate 200.

The display substrate 200 may include bonding pads 210 for mounting the light emitting devices 100. The bonding pads 210 may be formed of a metal layer including In or Sn, for example.

Bonding metal layers 20*cp*, 30*cp*, 40*cp*, and 50*cp* are bonded on the bonding pads 210 so that the light emitting device 100 is mounted on the display substrate 200. The bonding pad 210 and the bonding metal layers 20*cp*, 30*cp*, 40*cp*, and 50*cp* may be attached to one another through eutectic bonding.

According to exemplary embodiments, since the light emitting device having a structure in which the first, second, and third light emitting stacks are stacked one above another is provided, a mounting process time may be reduced. Furthermore, since the bonding metal layers and the connection electrodes are included together, the light emitting device suitable for probing for electrical measurement and being mounted may be provided.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device, comprising:
a first light emitting stack;
a second light emitting stack disposed under the first light emitting stack;
a third light emitting stack disposed under the second light emitting stack;
first, second, third, and fourth connection electrodes disposed over the first light emitting stack, and electrically connected to the first, second, and third light emitting stacks; and
bonding metal layers disposed on upper surfaces of the first, second, third, and fourth connection electrodes,
wherein:
each of the first, second, third, and fourth connection electrodes includes a groove on an upper surface thereof;
the bonding metal layers cover the grooves of the first, second, third, and fourth connection electrodes, respectively;
the first light emitting stack is electrically connected to the first connection electrode and the fourth connection electrode;
the second light emitting stack is electrically connected to the second connection electrode and the fourth connection electrode; and
the third light emitting stack is electrically connected to the third connection electrode and the fourth connection electrode.

2. The light emitting device of claim 1, further comprising a barrier layer disposed between the bonding metal layer and the connection electrode.

3. The light emitting device of claim 1, wherein the bonding metal layer at least partially covers the upper surface of the connection electrode around the groove.

4. The light emitting device of claim 1, wherein the connection electrode includes Cu, and the bonding metal layer includes Au.

5. The light emitting device of claim 1, wherein:
each of the first, second, and third light emitting stacks includes a first conductivity type semiconductor layer and a second conductivity type semiconductor layer;
the first, second, and third connection electrodes are electrically connected to the second conductivity type semiconductor layers of the first, second, and third light emitting stacks, respectively; and
the fourth connection electrode is electrically connected to the first conductivity type semiconductor layers of the first, second, and third light emitting stacks.

6. The light emitting device of claim 5, wherein the first, second, third, and fourth connection electrodes are disposed in an upper region of the first conductivity type semiconductor layer of the first light emitting stack.

7. The light emitting device of claim 5, further comprising:
a first pad electrically connecting the first connection electrode to the first light emitting stack;
a second pad electrically connecting the second connection electrode to the second light emitting stack;
a third pad electrically connecting the third connection electrode to the third light emitting stack; and
a fourth pad electrically connecting the fourth connection electrode to the first, second, and third light emitting stacks.

8. The light emitting device of claim 7, further comprising:
a first lower contact electrode contacting the second conductivity type semiconductor layer of the first light emitting stack;
a second lower contact electrode contacting the second conductivity type semiconductor layer of the second light emitting stack; and
a third lower contact electrode contacting the second conductivity type semiconductor layer of the third light emitting stack,
wherein the first, second, and third pads are connected to the first, second, and third lower contact electrodes, respectively.

9. The light emitting device of claim 8, further comprising a first upper contact electrode in ohmic contact with the first conductivity type semiconductor layer of the first light emitting stack,
wherein the first conductivity type semiconductor layer of the first light emitting stack has a recessed region, and the first upper contact electrode is disposed in the recessed region.

10. The light emitting device of claim 9, wherein the fourth pad is connected to the first upper contact electrode.

11. A display apparatus, comprising:
a display substrate including bonding pads; and
light emitting devices disposed on the display substrate, each of the light emitting devices including:
a first light emitting stack;
a second light emitting stack disposed under the first light emitting stack;
a third light emitting stack disposed under the second light emitting stack;
first, second, third, and fourth connection electrodes disposed over the first light emitting stack, and electrically connected to the first, second, and third light emitting stacks; and
bonding metal layers disposed on upper surfaces of the first, second, third, and fourth connection electrodes,
wherein:
each of the first, second, third, and fourth connection electrodes includes a groove on an upper surface thereof;
the bonding metal layers cover the grooves of the first, second, third, and fourth connection electrodes, respectively;
the bonding metal layers are eutectic bonded to the bonding pads;
the first light emitting stack is electrically connected to the first connection electrode and the fourth connection electrode;
the second light emitting stack is electrically connected to the second connection electrode and the fourth connection electrode; and
the third light emitting stack is electrically connected to the third connection electrode and the fourth connection electrode.

12. The display apparatus of claim 11, wherein the bonding metal layers comprise Au and the bonding pads comprise at least one of In and Sn, and Au is eutectic bonded to In or Sn.

13. The display apparatus of claim 12, wherein the connection electrode includes Cu.

14. The display apparatus of claim 11, wherein the light emitting device further includes a barrier layer disposed between the bonding metal layer and the connection electrode.

15. The display apparatus of claim 11, wherein the bonding metal layer at least partially covers the upper surface of the connection electrode around the groove.

16. The display apparatus of claim 11, wherein:
each of the first, second, and third light emitting stacks includes a first conductivity type semiconductor layer and a second conductivity type semiconductor layer;
the first, second, and third connection electrodes are electrically connected to the second conductivity type semiconductor layers of the first, second, and third light emitting stacks, respectively; and
the fourth connection electrode is electrically connected to the first conductivity type semiconductor layers of the first, second, and third light emitting stacks.

17. The display apparatus of claim 16, wherein the first, second, third, and fourth connection electrodes are disposed in an upper region of the first conductivity type semiconductor layer of the first light emitting stack.

18. The display apparatus of claim 16, further including:
a first pad electrically connecting the first connection electrode to the first light emitting stack;
a second pad electrically connecting the second connection electrode to the second light emitting stack;
a third pad electrically connecting the third connection electrode to the third light emitting stack; and
a fourth pad electrically connecting the fourth connection electrode to the first, second, and third light emitting stacks.

* * * * *